(12) United States Patent
Taguchi

(10) Patent No.: US 6,465,879 B1
(45) Date of Patent: Oct. 15, 2002

(54) STRUCTURE FOR MOUNTING SEMICONDUCTOR DEVICE, METHOD OF MOUNTING SAME, SEMICONDUCTOR DEVICE, AND METHOD OF FABRICATING SAME

(75) Inventor: Noboru Taguchi, Saitama (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/690,459

(22) Filed: Oct. 18, 2000

(30) Foreign Application Priority Data

Oct. 19, 1999 (JP) .......................... 11-297028
Oct. 29, 1999 (JP) .......................... 11-308269

(51) Int. Cl.$^7$ .......................................... H01L 23/495
(52) U.S. Cl. ...................... 257/673; 257/737; 257/780; 438/613
(58) Field of Search ................... 257/737, 738, 257/780, 673; 438/613

(56) References Cited

U.S. PATENT DOCUMENTS

| | | | | |
|---|---|---|---|---|
| 5,034,345 A | * | 7/1991 | Shirahata ................... 438/183 |
| 5,436,198 A | * | 7/1995 | Shibata ...................... 257/629 |
| 5,669,545 A | * | 9/1997 | Pham et al. ................. 228/1.1 |
| 5,948,286 A | * | 9/1999 | Chalco et al. ......... 219/121.63 |
| 6,232,563 B1 | * | 5/2001 | Kim et al. ................... 257/737 |
| 6,285,085 B1 | * | 9/2001 | Taguchi ...................... 257/780 |

* cited by examiner

*Primary Examiner*—Hoai Ho
*Assistant Examiner*—Andy Huynh
(74) *Attorney, Agent, or Firm*—Armstrong, Westerman & Hattori, LLP

(57) ABSTRACT

A semiconductor device is disposed on a circuit board such that respective bumps are brought in direct contact with respective circuit electrodes, and diffusion bonding is caused to occur at respective bonding faces between the respective bumps and the respective circuit electrodes by applying ultrasonic vibration and a load from the side of the semiconductor device by an ultrasonic and load application tool, and by applying heat from the side of the circuit board, and thereafter, a gap between the semiconductor device and the circuit board is filled up with an insulating sealing resin, which is then cured.

7 Claims, 14 Drawing Sheets

F I G. 7
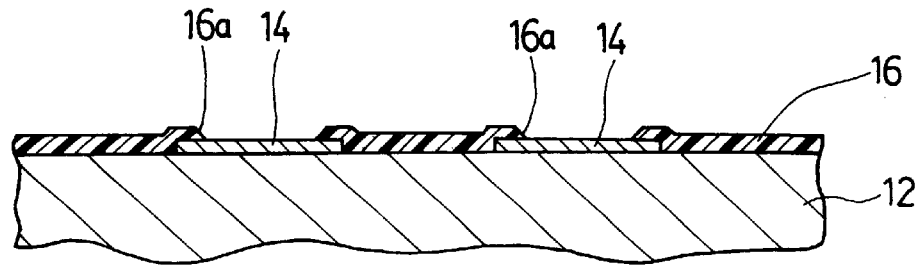
F I G. 8
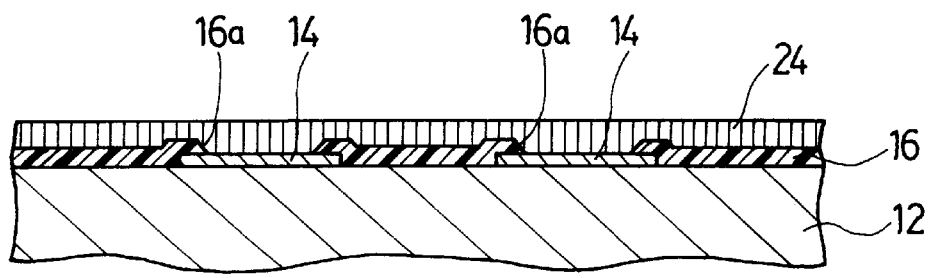
F I G. 9
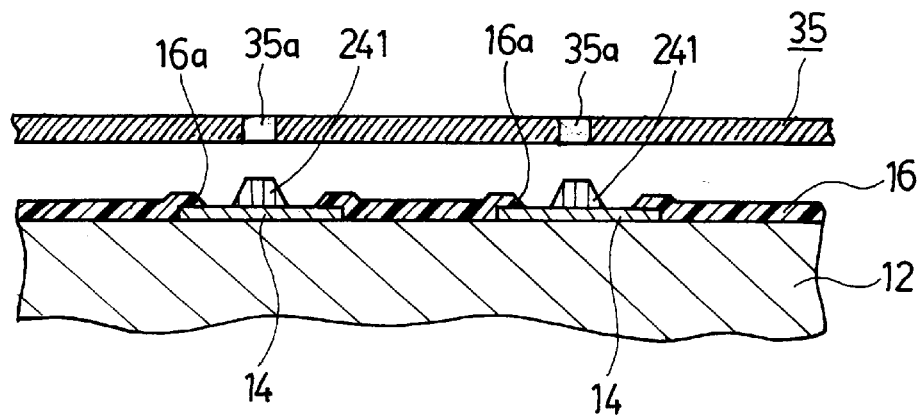

F I G. 13
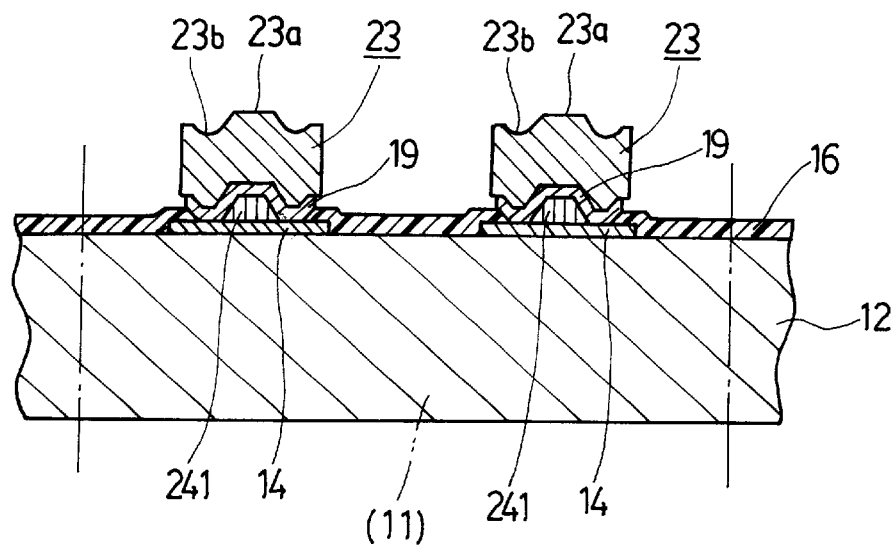
F I G. 14
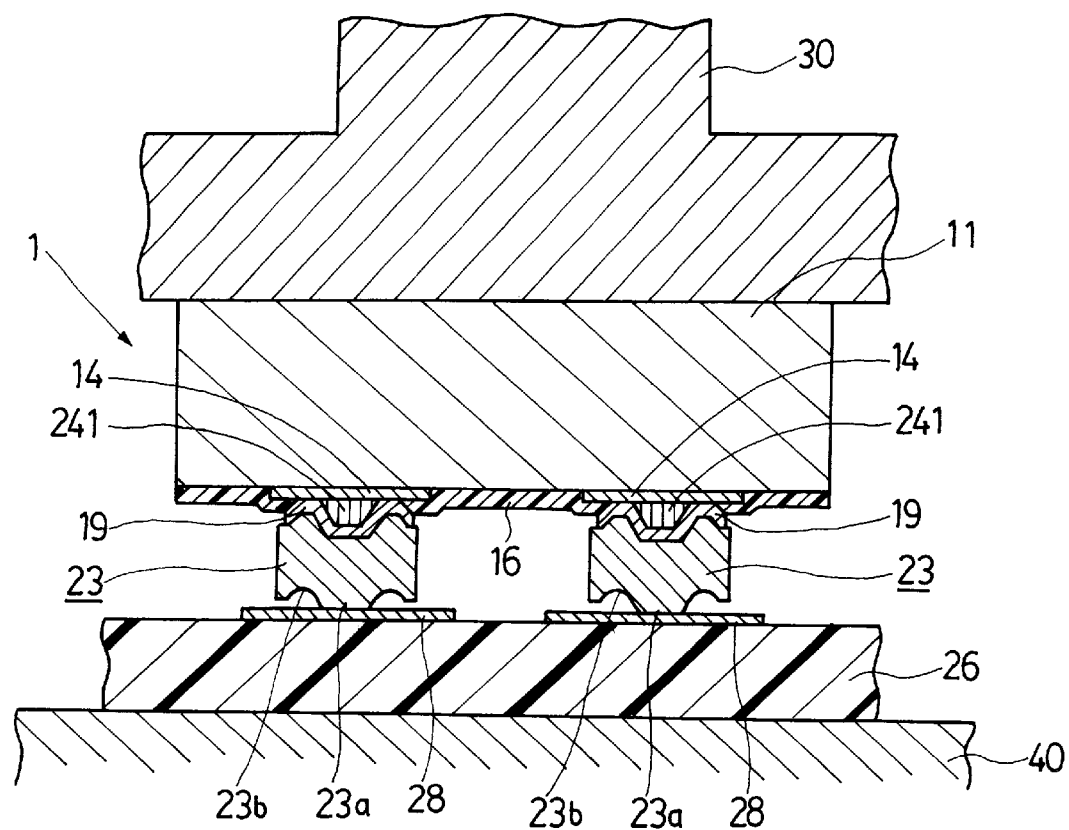

F I G. 22
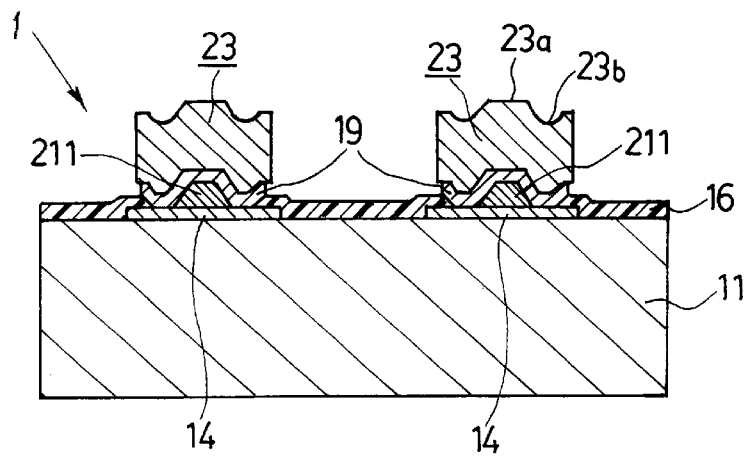
F I G. 23
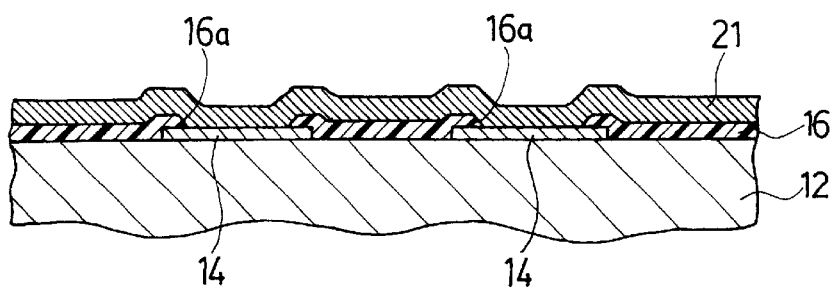
F I G. 24
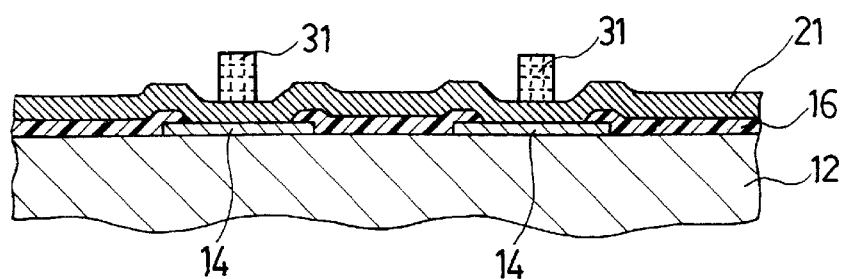
F I G. 25
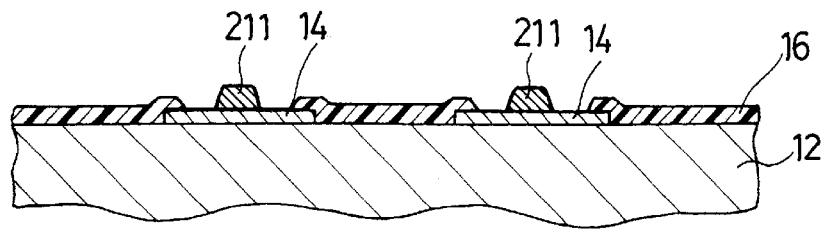

F I G. 30
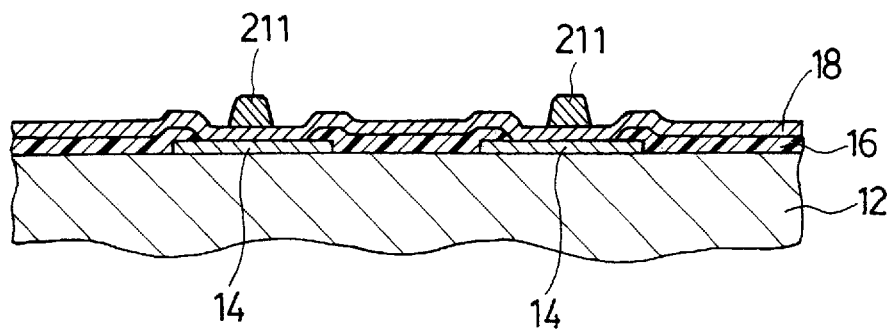
F I G. 31
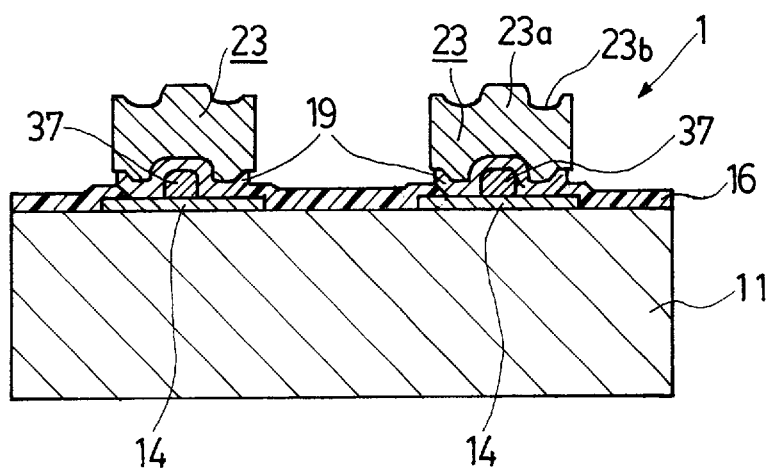
F I G. 32
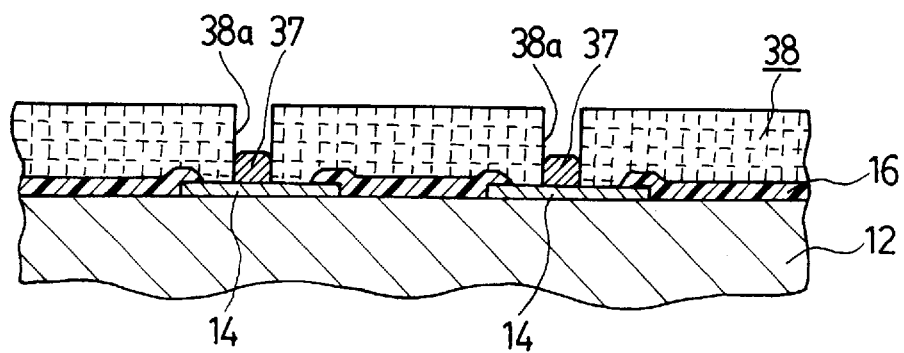

STRUCTURE FOR MOUNTING SEMICONDUCTOR DEVICE, METHOD OF MOUNTING SAME, SEMICONDUCTOR DEVICE, AND METHOD OF FABRICATING SAME

BACKGROUND OF THE INVENTION

1. Field of the Invention

The present invention relates to a structure for mounting a semiconductor device wherein a surface mount semiconductor device provided with bumps (protruded electrodes) is electrically and mechanically connected with a circuit board provided with circuit electrodes, and a method of mounting the same. Further, the invention is concerned with a semiconductor device suitable for use in obtaining the structure for mounting, and a method of fabricating the semiconductor device.

2. Description of the Related Art

Surface mount semiconductor devices have come to be in widespread use as a semiconductor device making up an integrated circuit (IC), a large scale integrated circuit (LSI), and so forth.

Among the surface mount semiconductor devices, there is one provided with a multitude of bumps placed in lines on the surface thereof for electrical and mechanical connection with circuit electrodes of a circuit board when mounting the same on the circuit board provided with the circuit electrodes.

FIG. 35 is a schematic view showing the construction in section of a semiconductor device provided with bumps formed in a straight-wall shape by way of example.

With the semiconductor device 10, a multitude of electrode pads 14 for connecting integrated circuits (not shown in the figure) with an external circuit are provided on the surface (in FIG. 35, the upper face) of a semiconductor chip 11, with the integrated circuits formed therein, in such a way as to run along side edges of the semiconductor chip 11 in the direction orthogonal to the plane of the figure. In FIG. 35, there is shown only one of a plurality of the electrode pads 14 placed in respective lines running along the side edge on both sides of the semiconductor chip 11.

An insulation film 16 having an opening formed over the respective electrode pads 14 in such a way as to cover the peripheral region of the respective electrode pads 14 while exposing the inside of the respective peripheral regions is formed across the surface of the semiconductor chip 11. A lower electrode 19 is provided so as to be in intimate contact with the peripheral region of the respective openings of the insulation film 16 and an exposed part of the respective electrode pads 14. Further, on top of the each lower electrode 19, a bump 22 formed in a straight-wall shape is provided.

There are also bumps formed in the shape of a mushroom wherein the top part of the respective bumps is larger in width than the base thereof. However, the bumps formed in a straight-wall shape are more suitable for reducing lateral spread thereof along a semiconductor chip, and to that extent, placement density of the bumps can be increased, so that a pitch at which connection thereof with an external circuit is made can be rendered minuscule.

FIG. 36 shows a conventional mounting structure wherein a semiconductor device provided with such bumps is mounted on a circuit board provided with circuit electrodes.

In FIG. 36, the semiconductor device 10 in a posture inverted from that shown in FIG. 35 is disposed on a circuit board 26 such that the bumps 22 are positioned on the underside of the semiconductor device 10, thereby bonding the semiconductor device 10 with the circuit board 26 by use of an anisotropic conductive adhesive 44.

The anisotropic conductive adhesive 44 is composed of a multitude of electrically conductive particles 42 dispersed in an insulating adhesive 46, and the respective bumps 22 are electrically connected with the respective circuit electrodes 28 on the circuit board 26 by the agency of the electrically conductive particles 42 while the semiconductor device 10 is mechanically connected with the circuit board 26 by agency of the insulating adhesive 46.

Herein, a method of fabricating the conventional semiconductor device shown in FIG. 35 is briefly described with reference to FIGS. 33 and 34, and a conventional method of mounting the same is described with reference to FIG. 36.

First, as shown in FIG. 33, across the surface of a semiconductor substrate 12 provided with integrated circuits (not shown) for a plurality of semiconductor chips and a plurality of electrode pads for connecting the integrated circuits with an external circuit, the insulation film 16 is formed, and an opening 16a is formed over the respective electrode pads 14 by photo etching method such that most of respective electrode pads 14 are exposed, leaving only the peripheral region thereof covered.

FIGS. 33 and 34 are enlarged sectional views showing only a portion (a region slightly larger than that corresponding to a unit of a semiconductor device) of the semiconductor substrate 12, respectively.

Subsequently, an aluminum film, a chromium film, and a copper film are sequentially deposited in that order by the sputtering method on the entire surface of the insulation film 16 and a portion of the respective electrode pads 14 exposed inside the respective openings 16a, on the semiconductor substrate 12, thereby forming a common electrode film 18 made up of layered films of aluminum-chromium-copper.

Thereafter, a photosensitive resin film 20 shown in FIG. 34 is formed to a thickness of 20 to 25 $\mu$m on the entire surface of the common electrode film 18 by the spin coater method, and an opening 20a of substantially the same size as the respective electrode pads 14 is formed on portions of the photosensitive resin film 20, over the respective electrode pads 14, by photolithography method.

Subsequently, the semiconductor substrate 12 is immersed in a gold plating bath composed of sodium gold sulfite, and by means of electroplating using the common electrode film 18 as a plating electrode, the bump 22 shown in FIG. 34 is formed to a thickness of 15 $\mu$m to 20 $\mu$m on the common electrode film 18 inside the respective openings 20a of the photosensitive resin film 20.

Thereafter, the photosensitive resin film 20 is removed, the common electrode film 18 is etched using the bumps 22 as etching masks, and most of the common electrode film 18, other than portions thereof underneath the bumps 22, is removed, thereby forming lower electrodes 19 shown in FIG. 35. Thus, a structure wherein the bump 22 is individually installed over the respective electrode pads 14 with the respective lower electrodes 19 interposed therebetween.

Subsequently, a dicing step is applied to the semiconductor chips 12 whereby the semiconductor chips 12 are cut into the individual semiconductor chips 11, thereby fabricating the semiconductor device 10 as shown in FIG. 35.

In mounting the semiconductor device 10 on the circuit board, the anisotropic conductive adhesive 44 composed of the electrically conductive particles 42 dispersed in the insulating adhesive 46 made of epoxy resin is interposed between the semiconductor device 10 having a plurality of the bumps 22 and the circuit board 26 having a plurality of the circuit electrodes 28 disposed opposite to the semiconductor device 10, whereupon pressure and heat are applied between the bumps 22 and the circuit electrodes 28.

As a result, the electrically conductive particles 42 are sandwiched between the respective bumps 22 and the respective circuit electrodes 28, thereby effecting electrical connection therebetween. At the same time, the semiconductor device 10 is mechanically connected with the circuit board 26, and connections between the respective bumps 22 and the respective circuit electrodes 28 are sealed by the agency of the insulating adhesive 46.

However, with such a conventional structure for mounting a semiconductor device, and a method of mounting the same as described above, ten or more pieces of the electrically conductive particles 42 need to be maintained between the respective bumps 22 and the respective circuit electrodes 28 on the circuit board 26 in order to ensure a sufficiently small connection resistance value, for example, 0.1Ω or less at the outset, and high reliability in connection therebetween.

With the electrically conductive particles 42 mixed in the insulating adhesive 46 of the anisotropic conductive adhesive 44, a bi-layered film made of nickel and gold is formed on the surface of plastic beads about 5 µm in diameter.

The electrically conductive particles 42 have a connection resistance value of about 1Ω per piece, and by maintaining ten pieces of the electrically conductive particles 42 between the respective bumps 22 and the respective circuit electrodes 28, it is possible to set a connection resistance value at the outset to about 0.1Ω, and to maintain a connection resistance value at 1Ω or lower after a reliability test at high temperature and high humidity is conducted in an atmosphere at a temperature of 85° C. and a humidity of 85% for 1000 hours.

The reason for an increase in the connection resistance value occurring after the reliability test at high temperature and high humidity is that adhesive strength of the insulating adhesive 46 is weakened due to degradation of epoxy resin based adhesive composing the insulating adhesive 46 interposed between the bumps 22 and the circuit electrodes 28, and a distance between the bumps 22 and the circuit electrodes 28 is slightly increased, thereby decreasing a connection area of the respective electrically conductive particles 42.

In order to secure ten or more pieces of the electrically conductive particles 42 between the bumps 22 and the circuit electrodes 28, the top face of the respective bumps 22 needs to have an area of 3000 $\mu m^2$ or more. Further, in order to ensure insulation between the bumps 22 adjacent to each other, a spacing three or more times (15 µm) a diameter (5 µm) of the respective electrically conductive particles 42 needs to be provided therebetween.

Accordingly, with the conventional structure for mounting the semiconductor device, and the method of mounting the same, it has been extremely difficult to connect the respective circuit electrodes 28 with the respective bumps 22 at a low connection resistance value, and to ensure reliable insulation between the bumps 22 adjacent to each other, thereby effecting connection between the respective circuit electrodes 28 and the respective bumps 22 at a minuscule pitch.

It is therefore an object of the invention to solve such problems as described above, so that, in surface mounting of a semiconductor device on a circuit board, connection resistance between bumps and circuit electrodes is rendered sufficiently small, and sufficient insulation between the bumps adjacent to each other is ensured, thereby enabling connection at high density to be effected at a minuscule pitch between the bumps.

SUMMARY OF THE INVENTION

The invention has been developed to solve the problem described above, and it is therefore an object of the invention to provide a structure for mounting a semiconductor device, a method of mounting the same, a semiconductor device suitable for use in obtaining the structure for mounting, and a method of fabricating the semiconductor device as described hereinafter.

First, the structure for mounting the semiconductor device according to the invention is a structure for mounting a semiconductor device provided with a plurality of electrode pads and a plurality of bumps individually connected with the respective electrode pads, formed on one face of a semiconductor chip thereof, on a circuit board provided with a plurality of circuit electrodes on one face thereof individually connected with the plurality of the bumps.

Further, the structure for mounting the semiconductor device is characterized in that an opposed face of the respective bumps of the semiconductor device is directly bonded with an opposed face of the respective circuit electrodes of the circuit board, diffusion bonding occurring at a bonding face therebetween.

The respective bumps are preferably formed of gold, and in a straight-wall shape, having a face thereof bonding with the respective circuit electrodes substantially planar (in a bonded state).

The method of mounting the semiconductor device according to the invention is a method of implementing the structure for mounting the semiconductor device described above, comprising:

a step of disposing the above-described semiconductor device provided with the plurality of bumps on the circuit board provided with the plurality of circuit electrodes such that the respective bumps are aligned with the respective circuit electrodes so as to be opposed to each other;

a step of bringing an opposed face of the respective bumps of the semiconductor device in direct contact with an opposed face of the respective circuit electrodes of the circuit board; and a step of causing diffusion bonding at a contact face between the respective bumps and the respective circuit electrodes by applying a load thereto while applying ultrasonic vibration or heat.

The above-described method of mounting the semiconductor device preferably further comprises a step of lowering hardness of the respective bumps of the semiconductor device by applying heat thereto prior to the step of disposing the semiconductor device on the circuit board.

In such a case, the semiconductor device provided with the respective bumps formed of gold is preferably employed, and in the step of lowering the hardness of the respective bumps, the application of heat is preferably performed at a temperature in a range of 250° C. to 350° C. in a furnace into which nitrogen gas is introduced so as to render Vickers hardness Hv of the respective bumps to be in a range of 40 to 60.

Further, in the step of causing diffusion bonding at the contact face between the respective bumps and the respective circuit electrodes, heat is preferably applied thereto while applying ultrasonic vibration and a load.

In such a case, the ultrasonic vibration is preferably applied at a frequency in a range of 20 kHz to 30 kHz with output thereof in a range of 50 mW to 200 mW for each of the bumps, the load applied is preferably in the order of 30 g to 100 g for each of the bumps, and the heat is preferably applied at a temperature in a range of 150° C. to 200° C.

Further, the ultrasonic vibration and the load are preferably applied from a face of the semiconductor device on a side opposite from a face thereof on which the bumps are provided, and the heat is preferably applied from a face of the circuit board on a side opposite from a face thereof on which the circuit electrodes are provided.

Further, the method of mounting the semiconductor device described above preferably further comprises a step of injecting a sealing resin composed of epoxy resin in a gap between the semiconductor device and the circuit board, and applying baking treatment thereto, thereby curing the sealing resin, after the step of causing diffusion bonding at the contact face between the respective bumps and the respective circuit electrodes.

The semiconductor device according to the invention comprises: a semiconductor chip provided with integrated circuits, and a plurality of electrode pads for connecting the integrated circuits with an external circuit; an insulation film covering a face of the semiconductor chip, on which the plurality of the electrode pads are provided, and having an opening over the respective electrode pads; a mound-like (pillow-like) member provided on the central part of the respective electrode pads inside the respective openings of the insulation film; a plurality of lower electrodes each provided over the peripheral region of the respective openings of the insulation film and the respective mound-like members in such a way as to be individually and electrically conductive with the respective electrode pads through the respective openings of the insulation film; and a plurality of bumps each provided on the respective lower electrodes and formed such that the central part of the top face thereof is raised higher than the peripheral region thereof to the extent of a thickness of the respective mound-like members.

The mound-like members may be formed of a photosensitive resin, the same material as the constituent material of the insulation film, an electrically conductive material, a metal film formed by an electroless plating process, or so forth.

Further, the mound-like member may be provided on respective lower electrodes formed on top of the respective electrode pads.

The method of fabricating a semiconductor device according to the invention comprises the following steps from A to J:

A. a step of preparing a semiconductor substrate provided with integrated circuits for a plurality of semiconductor chips and a plurality of electrode pads for connecting the integrated circuits with an external circuit, and forming an insulation film having an opening over the respective electrode pads, on the surface of the semiconductor substrate;

B. a step of applying a first photosensitive resin to the entire surface of the semiconductor substrate with the insulation film formed thereon to a thickness thicker than the insulation film;

C. a step of patterning the first photosensitive resin by use of photolithography treatment such that portions thereof only on top of the central part of the respective electrode pads are left out to serve as mound-like members;

D. a step of forming a common electrode film connected with the respective electrode pads through the respective openings on the entire surface of the semiconductor substrate provided with the insulation film formed thereon;

E. a step of applying a second photosensitive resin on the entire surface of the common electrode film;

F. a step of patterning the second photosensitive resin by use of photolithography treatment such that an opening substantially in the same size as the respective electrode pads is formed over the respective electrode pads;

G. a step of forming a bump on the common electrode film inside the respective openings of the second photosensitive resin by means of plating;

H. a step of removing the second photosensitive resin;

I. a step of forming a lower electrode on the respective electrode pads by patterning the common electrode film by means of etching thereof using the respective bumps as etching masks; and J. a step of cutting the semiconductor substrate into semiconductor chips for individual semiconductor devices.

Further, the steps from A to C of the method of fabricating the semiconductor device may be replaced with the following steps comprising:

a step of preparing a semiconductor substrate provided with integrated circuits for a plurality of semiconductor chips and a plurality of electrode pads for connecting the integrated circuits with an external circuit, and forming an insulation film on the entire surface of the semiconductor substrate;

a step of applying a first photosensitive resin to the entire surface of the insulation film;

a step of patterning the first photosensitive resin by use of photolithography treatment such that an opening in a ring-like shape is formed over the respective electrode pads;

a step of forming an opening in a ring-like shape in portions of the insulation film over the respective electrode pads by patterning the insulation film by means of etching thereof using the first photosensitive resin as a mask; and a step of removing the first photosensitive resin.

Furthermore, the steps B and C of the above-described method of fabricating the semiconductor device may be replaced with the following steps comprising:

a step of forming an electrically conductive film thicker than the insulation film on the entire surface of the semiconductor substrate provided with the insulation film formed thereon;

a step of applying a first photosensitive resin to the entire surface of the electrically conductive film;

a step of patterning the first photosensitive resin by use of photolithography treatment such that portions thereof only on top of the central part of the respective electrode pads are left out;

a step of patterning the electrically conductive film through etching thereof using the portions of the first photosensitive resin as masks such that portions of the electrically conductive film only on top of the central part of the respective electrode pads are left out to serve as mound-like members; and a step of removing the first photosensitive resin.

Otherwise, the steps from B to D of the above-described method of fabricating the semiconductor device may be replaced with the following steps comprising:

a step of forming a common electrode film connected with the respective electrode pads through the respective openings on the entire face of the semiconductor substrate provided with the insulation film formed thereon;

a step of forming an electrically conductive film on the entire surface of the common electrode film to a thickness thicker than the insulation film;

a step of applying a first photosensitive resin to the entire surface of the electrically conductive film;

a step of patterning the first photosensitive resin by use of photolithography treatment such that only portions thereof on the electrically conductive film corresponding to the central part of the respective electrode pads are left out;

a step of patterning the electrically conductive film through etching thereof using the portions of the first photosensitive resin as masks such that only portions of the electrically conductive film on the common electrode film corresponding to the central part of the respective electrode pads are left out to serve as mound-like members; and a step of removing the first photosensitive resin.

Still further, the steps B and C of the above-described method of fabricating the semiconductor device may be replaced with the following steps comprising:

a step of applying a first photosensitive resin to the entire surface of the semiconductor substrate with the insulation film formed thereon;

a step of patterning the first photosensitive resin by use of photolithography treatment such that an opening is formed only on top of the central part of the respective electrode pads;

a step of forming a mound-like member composed of a metal film by means of plating on the respective electrode pads inside the respective openings of the first photosensitive resin; and a step of removing the first photosensitive resin.

With the respective methods of fabricating the semiconductor device described above, a step of lowering hardness of the respective bumps by applying heat thereto is preferably performed between the step of forming the lower electrodes and the step of cutting the semiconductor substrate.

In such a case, in the step of forming bumps, the respective bumps are preferably formed of gold, and in the step of lowering the hardness of the respective bumps, the application of heat is preferably performed at a temperature in a range of 250° C. to 350° C. in a furnace into which nitrogen gas is introduced so as to render Vickers hardness of the respective bumps to be in a range of 40 to 60.

The above and other objects, features and advantages of the invention will be apparent from the following detailed description which is to be read in conjunction with the accompanying drawings.

BRIEF DESCRIPTION OF THE DRAWINGS

FIGS. 7 to 13 are schematic sectional views of a portion of a semiconductor substrate, sequentially showing respective steps of a first embodiment of a method of fabricating a semiconductor device according to the invention;

FIGS. 14 and 15 are schematic sectional views showing mounting steps of a second embodiment of a method of mounting a semiconductor device according to the invention;

FIG. 22 is a schematic sectional view showing a third embodiment of a semiconductor device according to the invention;

FIGS. 23 to 25 are schematic sectional views of a portion of a semiconductor substrate, sequentially showing respective steps of a third embodiment of a method of fabricating a semiconductor device according to the invention;

FIGS. 27 to 30 are schematic sectional views of a portion of a semiconductor substrate, sequentially showing respective steps of a fourth embodiment of a method of fabricating a semiconductor device according to the invention;

FIG. 31 is a schematic sectional view showing a fifth embodiment of a semiconductor device according to the invention;

FIG. 32 is a schematic sectional view of a portion of a semiconductor substrate, showing an intermediate step of a fifth embodiment of a method of fabricating a semiconductor device according to the invention;

DETAILED DESCRIPTION OF THE PREFERRED EMBODIMENTS

Preferred embodiments of a structure for mounting a semiconductor device, a method of mounting the semiconductor device, the semiconductor device, and a method of fabricating the same, according to the invention, are described, respectively, hereinafter with reference to the accompanying drawings.

In respective figures used in description thereof, an enlarged view of a height of protruded electrodes (referred to hereinafter merely as bumps) of the semiconductor device is shown, and integrated circuits formed inside a semiconductor chip are not shown. Further, only a portion of a semiconductor substrate, slightly larger than a region corresponding to the semiconductor chip for a unit of the semiconductor device is shown in the figure.

Figure 1:
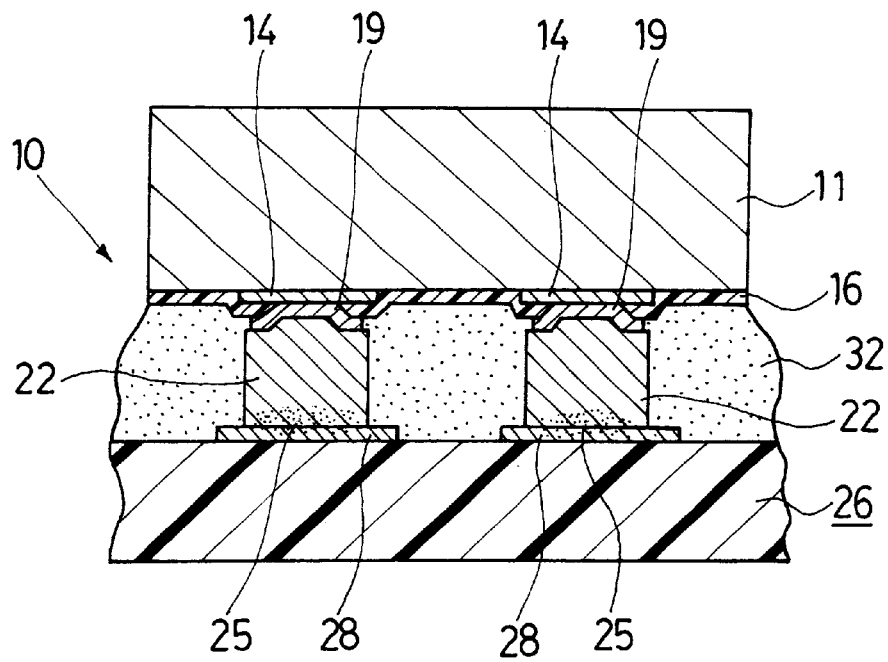
FIG. 1 is a schematic sectional view showing a first embodiment of a structure for mounting a semiconductor device according to the invention.
Figure 4:
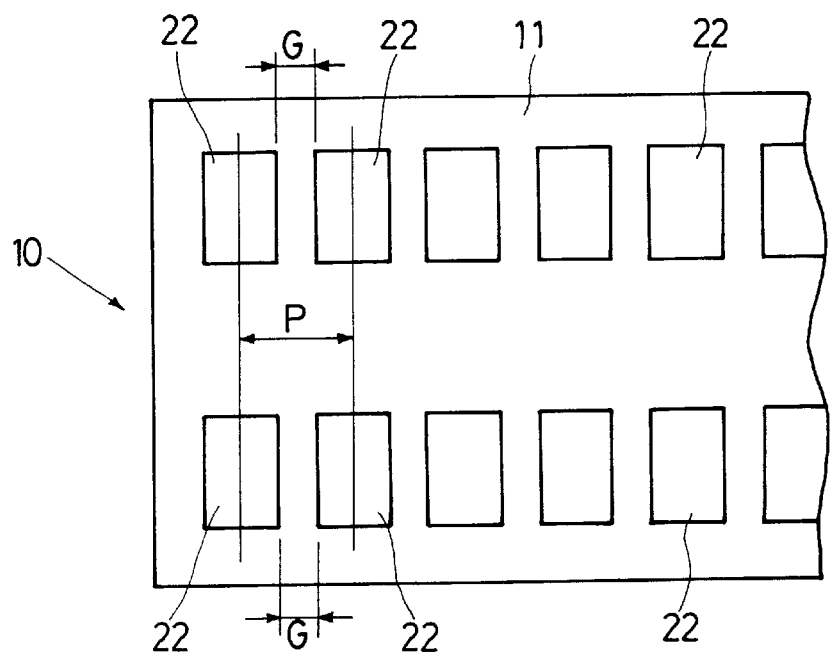
FIG. 4 is a schematic illustration showing planar configuration of bumps (protruded electrodes) on a semiconductor chip of a semiconductor device according to the invention.

First Embodiment of a Structure for Mounting a Semiconductor Device: FIGS. 1 and 4

A first embodiment of a structure for mounting a semiconductor device according to the invention is first described hereinafter with reference to FIG. 1.

Figure 35:
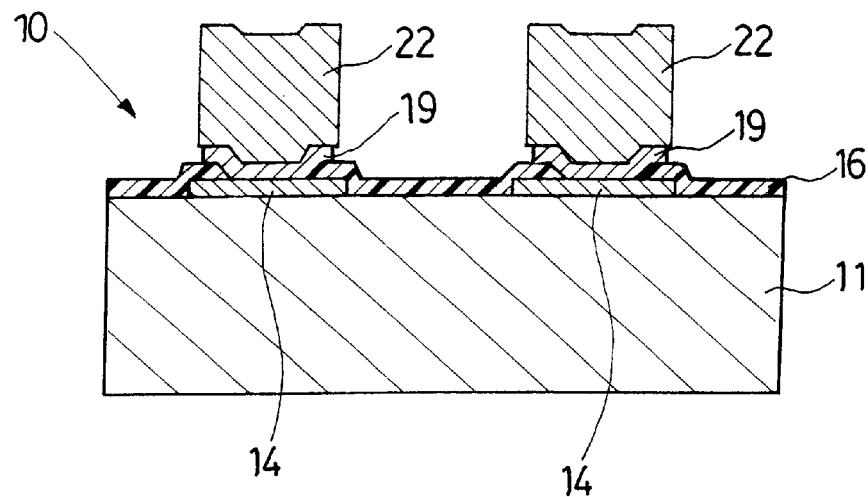
FIG. 35 is a schematic sectional view showing a conventional surface mount semiconductor device.
Figure 36:
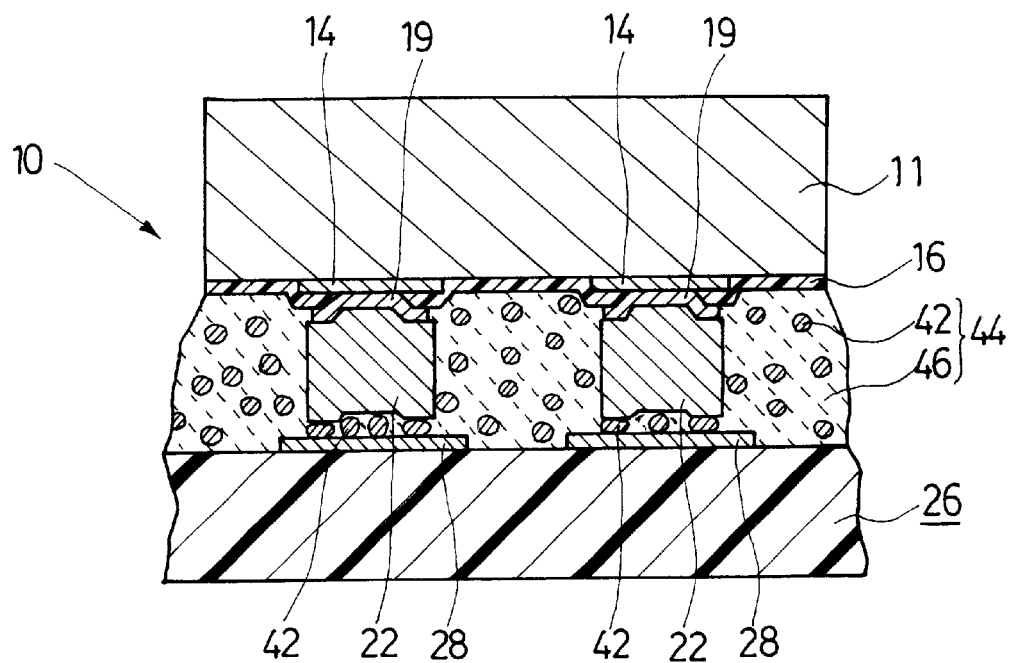
FIG. 36 is a schematic sectional view showing a conventional structure for mounting a semiconductor device.

In this embodiment, the construction of the semiconductor device to be mounted on a circuit board is the same as that for the conventional semiconductor device described with reference to FIG. 35. That is, with the semiconductor device 10 shown in FIG. 1, a multitude of electrode pads 14 for connecting integrated circuits with an external circuit are provided on one face of a semiconductor chip 11 provided with the integrated circuits formed therein in such a way as to run along the side edges of the semiconductor chip 11 in the direction orthogonal to the plane of the figure.

An insulation film 16 having an opening formed over the respective electrode pads 14 in such a way as to cover the peripheral region of the respective electrode pads 14 while exposing the inside of the respective peripheral regions is formed across the entire surface of the semiconductor chip 11. Further, a lower electrode 19 is provided so as to be in intimate contact with the peripheral region of the respective openings of the insulation film 16 and an exposed part of the respective electrode pads 14. Furthermore, on top of the respective lower electrodes 19, a bump 22 formed in a straight-wall shape is provided.

The lower electrodes 19 have a bi-layered structure wherein a lower layer in intimate contact with the respective electrode pads 14 is formed of titanium-tungsten alloy containing 20 wt. % of titanium to a thickness of 0.04 $\mu$m, and on top of the lower layer, an upper layer is formed of copper to a thickness of 0.4 $\mu$m.

A titanium-tungsten alloy layer as the lower layer of the respective lower electrodes 19 serves as a barrier layer for preventing mutual diffusion from occurring between the lower electrodes 19 and the respective electrode pads 14 as well as a connection layer therebetween while a copper layer as the upper layer serves as a connection layer between the lower electrodes 19 and the respective bumps 22 as well as a plating electrode when forming the bumps 22 by means of electroplating.

The bumps 22 are gold plated layers formed to a thickness in a range of 15 to 20 $\mu$m by means of electroplating, and are formed so as not to protrude above the upper face of a photosensitive resin film used as a mask in the course of an electroplating process, so that the bumps 22 come to have a profile having straight line sidewalls.

Meanwhile, on one face of a circuit board 26 shown in FIG. 1, a multitude of circuit electrodes 28 to be individually connected with the respective bumps 22 are patterned. The circuit electrodes 28 are made up of metallic films, and have a three-layered structure wherein, for example, a copper film as the lowest layer, a nickel film, and a gold film are deposited on top of each other in that order.

As shown in FIG. 1, the semiconductor device 10 is directly bonded onto the circuit board 26 such that the top face of the respective bumps 22 are opposed to the respective circuit electrodes 28 of the circuit board 26. Connection therebetween at respective bonding faces 25 is effected through diffusion bonding.

Further, a gap between the semiconductor device 10 and the circuit board 26 is filled up with an insulating sealing resin 32, which is then cured, thereby preventing degradation of a diffusion bonded part and ingress of moisture thereinto.

The diffusion bonding between the bumps 22 and the circuit electrodes 28 will be described in detail with reference to an embodiment of a method of mounting the semiconductor device which will be described later, however, it can be said briefly that the diffusion bonding is implemented by applying ultrasonic waves and a load to the rear face of the semiconductor device 10 opposite from a face thereof on which the bumps 22 are formed, while heating from the rear face side of the circuit board 26 opposite from a side of a face thereof on which the circuit electrodes 28 are formed, thereby bonding the bumps 22 with the circuit electrodes 28.

As a result of the diffusion bonding, metal atoms and molecules present in the vicinity of the respective bonding faces 25 between the bumps 22 and the circuit electrodes 28 on both sides thereof are mutually diffused into each other, respectively, thereby effecting strong connection. In particular, in the case where metals present on both sides of the respective bonding faces 25 are gold, the diffusion bonding can be achieved with ease.

Thus, with the structure for mounting the semiconductor device according to the invention, since the bumps 22 are directly bonded with the circuit electrodes 28 at the respective bonding faces 25 by the diffusion bonding, reliable connection between the respective bumps 22 and the respective circuit electrodes 28 can be ensured at a low connection resistance value.

As described hereinbefore, with the conventional structure for mounting the semiconductor device, since electrical connection between the top face of the respective bumps 22 and the respective circuit electrodes 28 has been made by use of an anisotropic conductive adhesive containing electrically conductive particles only through a surface of the respective electrically conductive particles sandwiched therebetween, in contact with both, it has been necessary to secure the electrically conductive particles in the order of ten pieces for each of the bumps 22 in order to lower connection resistance therebetween, and consequently, to provide a large area at the top surface of the respective bumps 22 to that extent.

With this embodiment of the invention, however, since the entire area of the respective bonding faces 25 between the bumps 22 and the circuit electrodes 28 contributes to electrical connection therebetween, it is possible to ensure connection therebetween with certainty at a sufficiently low connection resistance even if an area of the respective bonding faces 25 is smaller.

Furthermore, as the sealing resin 32 is an insulating resin such as epoxy resin, and the like, there is no risk of electrical connection occurring between the bumps 22 adjacent to each other even if a spacing therebetween is narrow.

Accordingly, as shown in FIG. 4, with the semiconductor device 10, an area occupied by one of the bumps 22 on the semiconductor chip 11 can be reduced to about 50 $\mu$m$^2$ equivalent to one sixtieth of that in the order of 3000 $\mu$m in the conventional case, and a gap G between the bumps 22 adjacent to each other also can be reduced from about 15 $\mu$m for the conventional case to about 5 $\mu$m.

Consequently, a pitch at which the bumps 22 are placed in lines can be reduced to one tenth or less of that for the conventional case, so that high density mounting through connection at a minuscule pitch with high reliability can be effected.

It follows therefore that, with the structure for mounting the semiconductor device according to the invention, electrical and mechanical characteristics of connections between the bumps 22 and the circuit electrodes 28 can be considerably improved over those for the conventional structure for mounting the semiconductor device, thereby enabling high density mounting to be implemented with ease.

Figure 2:
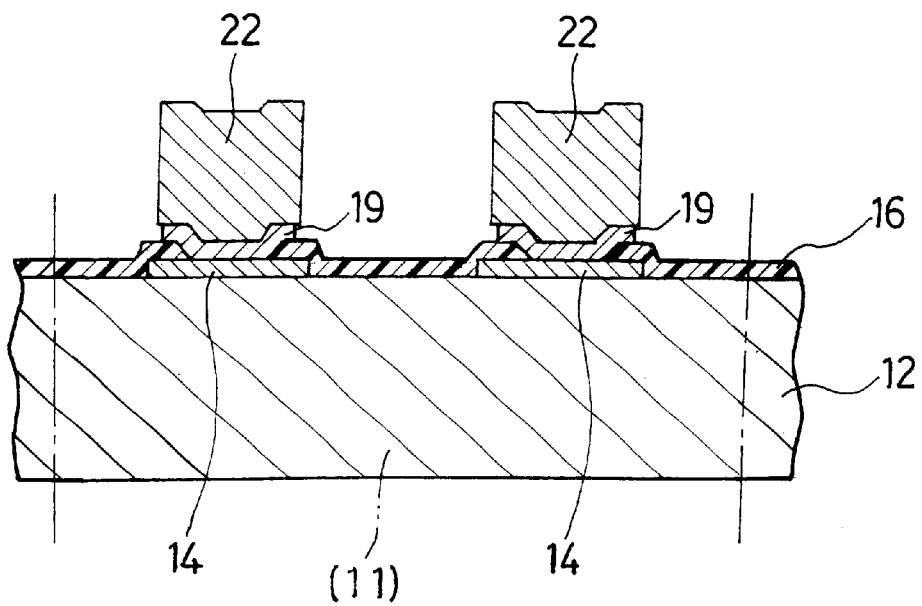
FIG. 2 is a schematic sectional view showing a portion of a semiconductor substrate used in describing a first embodiment of a method of mounting a semiconductor device according to the invention.
Figure 3:
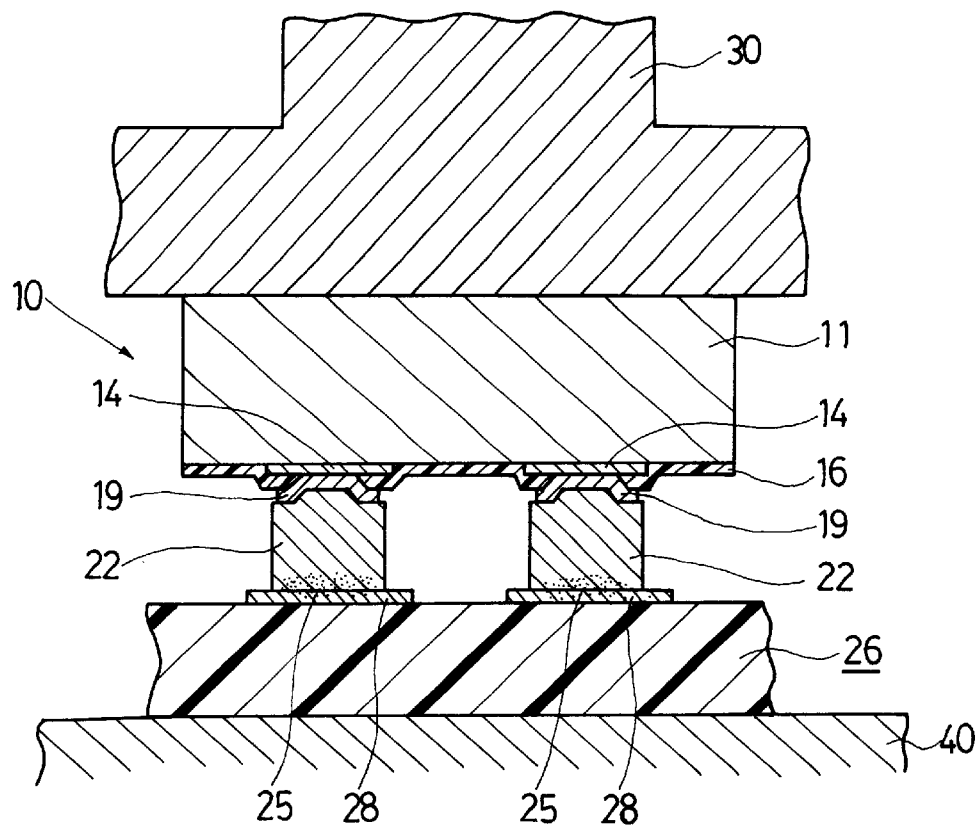
FIG. 3 is a schematic sectional view showing mounting steps of the first embodiment of the method of mounting the semiconductor device according to the invention.

First Embodiment of a Method of Mounting a Semiconductor Device: FIGS. 1 to 3

Next, a first embodiment of a method of mounting a semiconductor device according to the invention is described with reference to FIGS. 1 to 3. It is the method of mounting the semiconductor device for obtaining the structure for mounting the semiconductor device previously described with reference to FIG. 1.

With the method of mounting the semiconductor device according to this embodiment, the previously described semiconductor device 10 provided with a plurality of the bumps 22 is disposed on the circuit board 26 provided with a plurality of the circuit electrodes 28 in a first step such that the respective bumps 22 are aligned with the respective circuit electrodes 28 so as to be opposed to each other as shown in FIG. 3.

Then, the opposed face of the respective bumps 22 on the semiconductor device 10 is brought in direct contact with the opposed face of the respective circuit electrodes 28 on the circuit board 26.

Thereafter, an ultrasonic press-bonding tool 30 is brought into contact with the semiconductor device 10 from the rear face side thereof opposite from a side of a face thereof on which the bumps 22 are formed, and ultrasonic vibration at a frequency in a range of 20 kHz to 30 kHz is applied with output in a range of 50 mW to 200 mW for each of the bumps 22 while applying a load in the order of 30 g to 100 g for each of the bumps 22. In this case, the ultrasonic vibration is applied for the duration of 0.5 seconds to 2 seconds.

Further, the rear face of the circuit board 26, on a side opposite from a face thereof on which the circuit electrodes 28 are formed is brought into contact with a hot plate 40, and the circuit board 26 is disposed thereon, applying heat at a temperature in a range of 150° C. to 200° C. from the circuit board 26 side of the structure for mounting at the same time when the ultrasonic vibration and the load are applied from the semiconductor device 10 side thereof.

As a result, the top face of the respective bumps 22, having a slightly depressed portion in the central part thereof, is rendered substantially planar because the top face is pressed down in a somewhat softened condition due to heating, and comes into intimate contact with the surface of the respective circuit electrodes 28, whereupon metal atoms and molecules present in the vicinity of the respective bonding faces 25 on both sides thereof are mutually diffused into each other, respectively, due to the effect of wave motion energy caused by ultrasonic vibration and thermal energy caused by heating, thereby effecting diffusion bonding uniformly across the respective bonding faces 25.

With this embodiment, since the bumps 22 are made of gold, and at least the surface layer of the circuit electrodes 28 is also formed of a gold film, quite excellent diffusion bonding is effected. Accordingly, the respective bumps 22 can be connected with the respective circuit electrodes 28 at low resistance.

Thereafter, a sealing resin 32 composed of epoxy resin shown in FIG. 1 is injected in a gap between the semiconductor device 10 and the circuit board 26, and is cured by applying baking treatment thereto, thereby completing the structure for mounting the semiconductor device shown in FIG. 1.

In carrying out this embodiment, ultrasonic vibration is applied to the bumps 22 of the semiconductor device 10 and the circuit electrodes 28 of the circuit board 26, and a load is also applied thereto while applying heat in order to cause diffusion bonding to occur at the respective bonding faces 25, however, diffusion bonding can be caused to occur at the respective bonding faces 25 by applying a load thereto while applying either ultrasonic vibration or heat.

Further, with the method of mounting the semiconductor device according to this embodiment, it is preferable to perform a step of lowering hardness of the respective bumps 22 of the semiconductor device 10 by applying heating treatment thereto prior to a step of disposing the semiconductor device 10 on the circuit board 26.

In the case of employing the semiconductor device 10 provided with the respective bumps 22 made of gold as with this embodiment, the semiconductor device 10 is placed in a furnace set at a temperature of 300° C., and heat is applied thereto for 30 minutes while introducing nitrogen gas into the furnace at a flow rate of 20 liter per minute, thereby reducing the hardness of the bumps 22 to Vickers hardness Hv in a range of 40 to 60.

The purpose of reducing the hardness of the bumps 22 to that extent is to facilitate adhesion of the bumps 22 to the circuit board 26 by applying pressure at the time of mounting.

The reason for reduction in the hardness of the bumps 22 due to heating treatment applied thereto is because a plated coating to serve as the bumps 22, immediately after formed by a plating process, contains gasses of impurities such as hydrogen, carbon, and so on, and has Vickers hardness Hv in a range of 100 to 120, but undergoes recrystallization when the above-described heating treatment is applied thereto with the result that impurity gasses are evolved from the plated coating of gold constituting the bumps 22, and Vickers hardness Hv of the bumps 22 comes down close to that of pure gold.

Such heating treatment for reducing the hardness of the bumps 22 as described above is more efficiently carried out when simultaneously applied to all the bumps 22 on the semiconductor substrate 12 incorporating a multitude of the semiconductor devices as shown in FIG. 2.

That is, the baking treatment described above is preferably applied before dividing the semiconductor substrate 12 shown in FIG. 2 into the semiconductor chips 11 for individual semiconductor devices by cutting the semiconductor substrate 12 at positions indicated by chain lines in a dicing step, thereby reducing the hardness of all the bumps 22.

Figure 5:
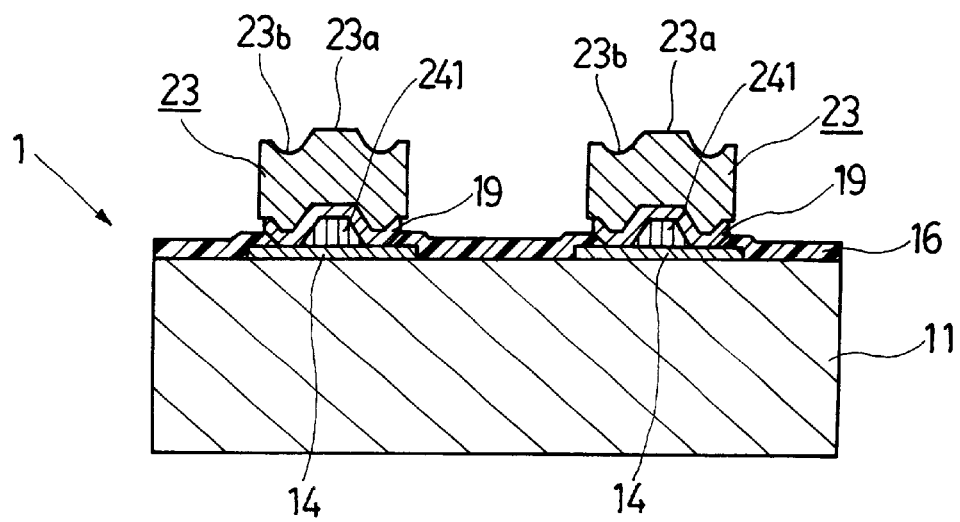
FIG. 5 is a schematic sectional view showing a first embodiment of a semiconductor device according to the invention.

First Embodiment of a Semiconductor Device: FIG. 5

Next, a first embodiment of a semiconductor device according to the invention is described hereinafter with reference to a schematic sectional view thereof shown in FIG. 5. In FIG. 5, parts corresponding to those of the semiconductor device 10 shown in FIGS. 1 and 35 are denoted by like reference numerals.

With a semiconductor device 1 according to this embodiment, on the upper face of a semiconductor chip 11 provided with integrated circuits and a plurality of electrode pads 14 for connecting the integrated circuits with an external circuit, an insulation film 16 having an opening over the respective electrode pads 14 is provided, covering the upper face of the semiconductor chip 11 with the electrode pads 14 provided thereon as with the case of the semiconductor device 10 shown in FIG. 1.

However, the semiconductor device 1 differs from the semiconductor device 10 shown in FIG. 1 in that a mound-like member 241 is provided on top of the central part of the respective electrode pads 14 inside the respective openings of the insulation film 16.

Further, a lower electrode 19 is provided over the peripheral region of the respective openings of the insulation film 16 and the respective mound-like members 241 in such a way as to be individually and electrically conductive with the respective electrode pads 14 through the respective openings of the insulation film 16. For the sake of convenience, the lower electrode 19 is denoted by the same reference numeral as that for the lower electrode of the conventional semiconductor device 10, but is formed in a convex shape in section with a raised central part thereof being formed on top of the respective mound-like members 241.

A bump 23 is formed on top of the respective lower electrodes 19, and as shown in the figure, the top face thereof is formed in a convex shape in section such that the central part 23a thereof is raised higher than the peripheral part 23b thereof to the extent of a thickness of the respective mound-like members 241.

Figure 6:
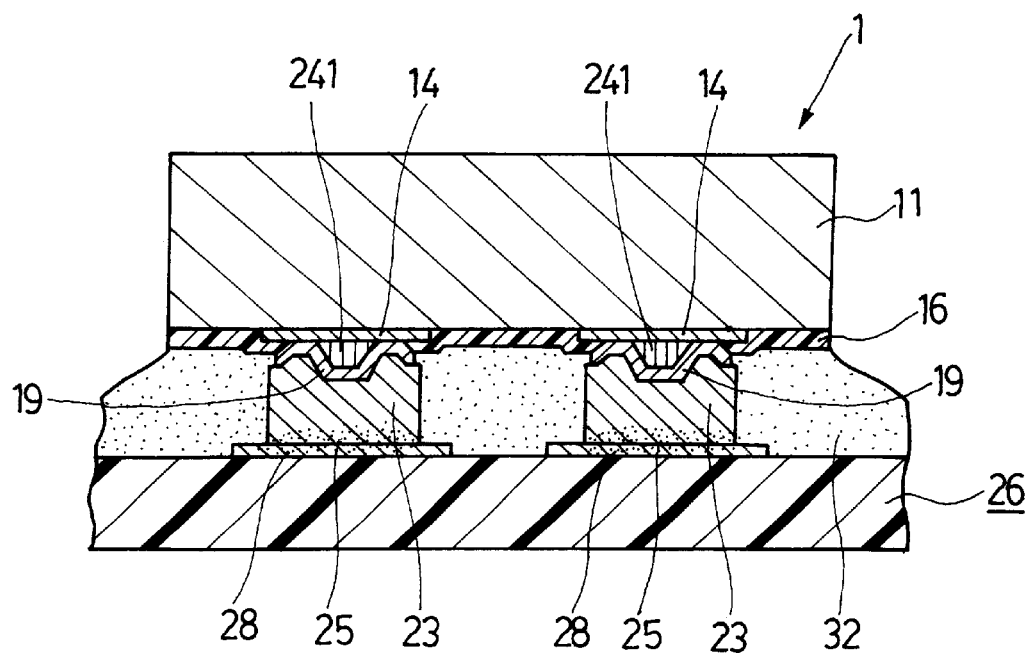
FIG. 6 is a schematic sectional view showing a second embodiment of a structure for mounting a semiconductor device according to the invention.

By forming the top face of the respective bumps 23 in the convex shape as described above, in a step of causing diffusion bonding between the respective bumps 23 and the respective circuit electrodes by applying a load thereto while applying ultrasonic vibration and/or heat when the semiconductor device 1 is mounted on a circuit board in the same way as the previously-described method of mounting, diffusion bonding will proceed from the central part 23a of the respective bumps 23 towards the peripheral part 23b, thus making it possible to effect diffusion bonding with certainty across the top face of the respective bumps 23. Second Embodiment of a Structure for Mounting a Semiconductor Device: FIG.6

A second embodiment of a structure for mounting a semiconductor device according to the invention is described hereinafter with reference to a schematic sectional view shown in FIG. 6.

The structure for mounting the semiconductor device according to this embodiment is substantially the same as the structure for mounting the semiconductor device according to the first embodiment as described with reference to FIG. 1, and in FIG. 6, parts corresponding to those in FIG. 1 are denoted by like reference numerals. With the structure for mounting the semiconductor device according to this embodiment, the semiconductor device 1 shown in FIG. 5, in an inverted posture, is mounted on a circuit board 26 provided with circuit electrodes 28.

The top face of respective bumps 23 of the semiconductor device 1 is crushed to some extent by applying heat and a load thereto when diffusion bonding thereof with the circuit electrodes 28 is carried out, thereby forming substantially planar bonding faces 25. Then, diffusion bonding will proceed from the central part 23a of the respective bumps 23, shown in FIG. 5, towards the peripheral part 23b, thus effecting with certainty diffusion bonding of the respective bumps 23 across the top face thereof with the respective circuit electrodes 28.

Further, this embodiment is the same as the first embodiment described with reference to FIG. 1 in that a gap between the semiconductor device 1 and the circuit board 26 is filled up with a sealing resin 32, which is then cured.

With the structure for mounting the semiconductor device according to this embodiment as well, it is possible to reduce considerably connection resistance between the respective bumps 23 of the semiconductor device 1 and the respective circuit electrodes 28 of the circuit board 26. As a result, an area occupied by the respective bumps 23 can be reduced, and in addition, it is possible to design in such a way as to render a gap between the bumps 23, adjacent to each other, smaller since an anisotropic conductive adhesive is not used. Accordingly, as described hereinbefore with reference to the first embodiment, it becomes possible to implement microscopic connection, and a structure for high density mounting.

First Embodiment of a Method of Fabricating a Semiconductor Device: FIGS. 7 to 13

A method of fabricating the semiconductor device shown in FIG. 5 is described hereinafter with reference to FIGS. 7 to 13. FIGS. 7 to 13 are sectional views showing steps of the method of fabricating the semiconductor device in sequence.

As shown in FIG. 7, an insulation film 16 is first formed to a thickness in a range of 0.8 $\mu$m to 1.0 $\mu$m on the entire surface of a semiconductor substrate 12 incorporating integrated circuits for a plurality of semiconductor chips, and provided with a plurality of electrode pads 14 for the respective semiconductor chips, formed on the surface thereof. Then, the insulation film 16 is patterned by photoetching techniques so as to cover only the peripheral region of the respective electrode pads 14, and to expose most of the respective electrode pads 14, thereby forming openings 16a.

Subsequently, as shown in FIG. 8, a first photosensitive resin 24 composed of a photosensitive polyimide resin is applied by the spin coater method to a thickness of 2 $\mu$m to 5 $\mu$m on the entire surface of the semiconductor substrate 12 with the insulation film 16 formed thereon.

Thereafter, as shown in FIG. 9, the first photosensitive resin 24 is patterned by photolithography treatment comprising exposure and development treatments using a predetermined photomask 35 such that a mound-like member 241 is formed substantially on top of the central part of the respective electrode pads 14.

The first photosensitive resin 24 is a positive photosensitive resin, and the photomask 35 is a shading member provided with a light-transmitting part 35a in a circular shape, formed only in portions thereof corresponding to regions (a substantially central part of the respective electrode pads 14) where the respective mound-like members 241 are to be formed.

The exposure treatment is applied to the first photosensitive resin 24 with the photomask 35 disposed at a short distance away from the first photosensitive resin 24, whereupon the first photosensitive resin 24 is exposed to light irradiated from above the photomask 35 through the respective light-transmitting parts 35a. However, at this point in time, not only portions of the first photosensitive resin 24, corresponding to the respective light-transmitting parts 35a in the circular shape, are exposed to light, but also portions thereof on the periphery of the respective light-transmitting parts 35a are exposed to light to some extent due to light waves rounding about the respective light-transmitting parts 35a.

By developing and patterning the first photosensitive resin 24 after the exposure treatment is applied thereto, the mound-like member 241 in the shape of a trapezoid, left out substantially at the central part of the respective electrode pads 14, can be formed as shown in FIG. 9.

Thereafter, baking treatment is applied in two stages, that is, on one condition of temperature at 150° C. kept for 30 minutes, and on the other condition of temperature at 350° C. kept for 30 minutes while maintaining oxygen concentration at 20 ppm or less all the time.

Herein, the baking treatment applied at a lower temperature is intended to cause gas contained in polyimide resin of the mound-like members 241 composed of the first photosensitive resin 24 to volatilize, and the baking treatment applied at a higher temperature is intended to polymerize the polyimide resin.

Figure 10:
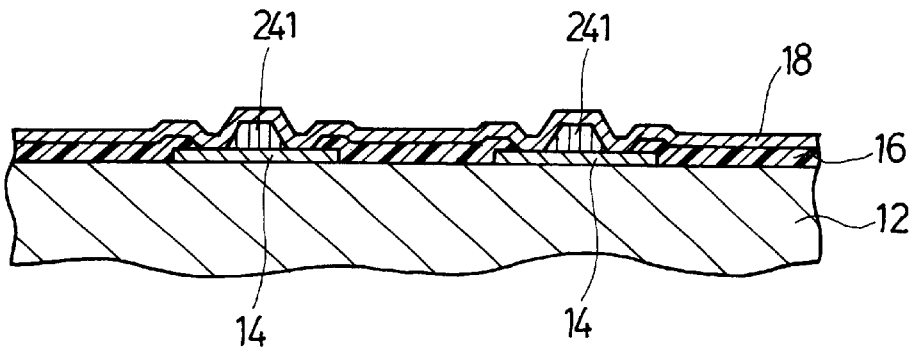

In a subsequent step, as shown in FIG. 10, a common electrode film 18 is formed on the entire surface of the semiconductor substrate 12 by the sputtering method.

The common electrode film 18 is formed to have a bi-layer structure wherein, for example, a titanium-tungsten alloy film containing 20 wt. % of titanium is formed to a thickness of 0.04 μm as an under layer, and a copper layer is formed to a thickness of 0.4 μm as an upper layer formed on top of the under layer.

For the common electrode film 18, a stable constituent material for electrodes is selected that has excellent electrical and mechanical continuity with the electrode pads 14 as well as an electrode material for bumps 23 to be formed later on, and that causes no mutual diffusion between these electrode materials.

For this reason, the common electrode film 18 may be of a triple-layer structure composed of titanium-tungsten alloy—copper—gold, aluminum chromium—gold, aluminum—titanium—copper, and so forth, or of a bi-layer structure composed of titanium—palladium, titanium—gold, titanium13 platinum, titanium-tungsten alloy—palladium, titanium-tungsten alloy—gold, titanium-tungsten alloy—platinum or so forth besides the above-described constituent materials.

Figure 11:
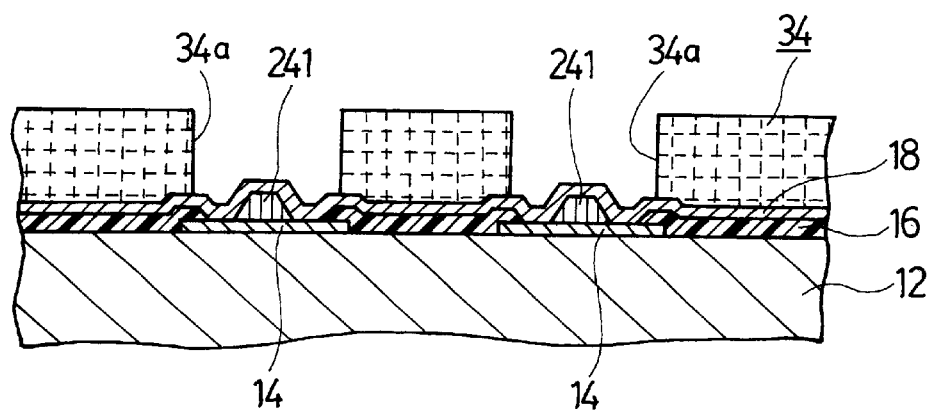

Thereafter, as shown in FIG. 11, a second photosensitive resin 34 is applied by the spin coater method to a thickness of 20 μm to 25 μm on the entire surface of the common electrode film 18.

Subsequently, the second photosensitive resin 34 is patterned by photolithography treatment where exposure and development treatments are applied thereto using a predetermined photomask such that openings 34a are formed. The respective openings 34a are formed over the respective electrode pads 14 so as to be substantially in the same size as the respective electrode pads 14. The interior of the respective openings 34a of the second photosensitive resin 34 represents a region where each of the bumps is formed.

Figure 12:
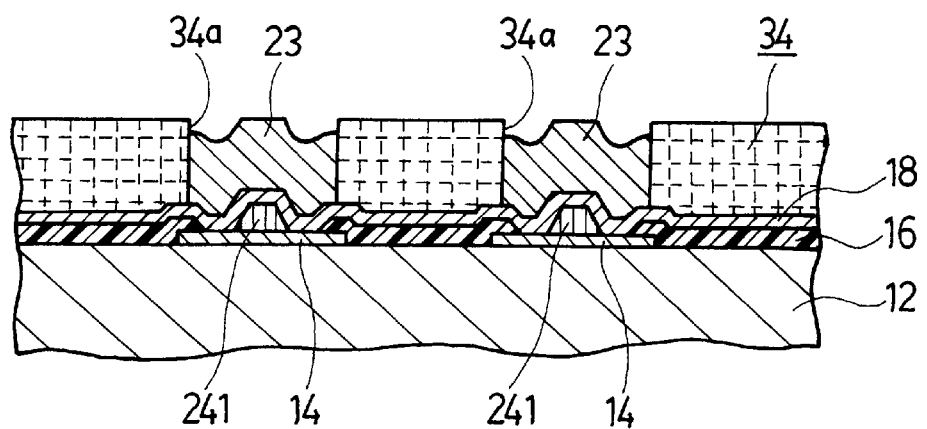

Subsequently, as shown in FIG. 12, using the second photosensitive resin 34 patterned as a plating mask, the bump 23 composed of a gold plated layer is formed over the common electrode film 18 inside the respective openings 34a.

In this case, electroplating is carried out in a gold plating bath composed of sodium gold sulfite, kept at 65° C., using the common electrode film 18 as a plating electrode, on a condition of current density at 0.8 A/dm$^2$, thereby forming the gold plated layer to a thickness of 15 μm to 20 μm to serve as the bumps 23.

In this connection, by forming the gold plated layer so as not to allow the peripheral region thereof to protrude above the upper face of the photosensitive resin 34 serving as a mask in the course of the electroplating process, the bumps 23 in sectional shape come to have a profile having straight line sidewalls as shown in the figure. Further, due to the convex shape of the respective mound-like member 241 composed of the first photosensitive resin 24, the bumps 23 can be formed so as to have the top face with the central part thereof higher than the peripheral part thereof.

Prior to the formation of the bump 23 inside the respective openings 34a of the second photosensitive resin 34 by the plating process, a hydrophilic treatment is preferably applied. By so doing, wettability of a plating bath against the second photosensitive resin 34 is rendered excellent, so that the plating bath can be sufficiently supplied inside the respective openings 34a of the second photosensitive resin 34 which are minuscule, thereby improving covering power of the plated coating.

The hydrophilic treatment may be applied by use of a wet method using a liquid chemical composed of, for example, a mixed solution of sulfuric acid and aqueous hydrogen peroxide, or by use of a dry method using, for example, oxygen plasma.

As described above, the top of the respective bump 23 can be formed into a convex shape with the central part 23a thereof higher than the peripheral part 23b thereof as shown in FIG. 13 due to a thickness of the respective mound-like members 241 composed of the first photosensitive resin 24 and formed in a convex shape.

That is, by varying the thickness of the first photosensitive resin 24, it is possible to control a step size, representing the difference in height between the central part 23a of the respective bump 23 and the peripheral part 23b thereof.

Thereafter, portions of the second photosensitive resin 34, used as the plating mask, is removed by use of a wet remover.

Subsequently, copper which is a metal composing the upper layer of the common electrode film 18 is etched with "Enstrip C" (trade name), which is the etchant for copper, manufactured by Meltex, Inc. for the duration of 30% over-etching time, using the bumps 23 as etching masks.

Subsequently, titanium-tungsten alloy which is a metal composing the under layer of the common electrode film 18, serving as a barrier layer as well as an adhesion layer, is etched with aqueous hydrogen peroxide for the duration of 30% over-etching time.

As a result, as shown in FIG. 13, the common electrode film 18 is patterned, thereby forming a lower electrode 19 from respective remaining portions of the common electrode film 18 between the respective electrode pads 14 and the respective bumps 23. The bump 23 formed on the respective lower electrodes 19 has the top formed in a convex shape with the central part 23a thereof higher by 2 to 5 μm than the peripheral part 23b thereof.

Herein, in executing etching of copper which is the metal composing the upper layer of the common electrode film 18, and titanium-tungsten alloy which is the metal composing the under layer of the common electrode film 18, serving as the barrier layer as well as the adhesion layer, over-etching is carried out. The reason for this is to remove the common electrode film 18 completely across the entire region of the semiconductor substrate 12.

Further, due to the over-etching described above, the periphery of the common electrode film 18 underlying the respective bumps 23 recedes from a patterned outline of the respective bumps 23. That is, a patterned shape of the respective lower electrodes 19 becomes smaller than that of the respective bumps 23.

Thereafter, the semiconductor substrate 12 is placed in a furnace into which nitrogen gas is fed at a rate of 20 liter per minute, and is subjected to heating treatment for 30 minutes while controlling temperature inside the furnace at 300° C., thereby lowering hardness of the bumps 23. As a result, the bumps 23 are rendered to have Vickers hardness Hv in a range of 40 to 60.

The reason for lowering the hardness of the bumps 23 in this way is to facilitate adhesion of the bumps 23 to circuit electrodes of a circuit board by applying a load at the time of mounting.

Herein, the reason why the hardness of the bumps 23 is lowered by applying heating treatment thereto is described hereinafter. The bumps 23, immediately after formed by means of plating, contain gasses of impurities such as hydrogen, carbon, and so on, and have Vickers hardness Hv in a range of 100 to 120, however, recrystallization proceeds when the above-described baking treatment is applied thereto with the result that impurity gasses are evolved from the bumps 23, and Vickers hardness Hv thereof come down close to that of pure gold.

Thereafter, in a dicing step, the semiconductor substrate 12 is cut along dicing lines indicated by chain lines shown in FIG. 13, and is divided into individual semiconductor chips 11, thus completing the semiconductor device shown in FIG. 5.

Second Embodiment of Method of Mounting the Semiconductor Device: FIGS. 5, 6, and 14, 15

Next, a second embodiment of a method of mounting a semiconductor device according to the invention is described with reference to FIGS. 5, 6 and FIGS. 14, 15. It is the method of mounting the semiconductor device for obtaining the structure for mounting the semiconductor device 1 shown in FIG. 5, fabricated as described above.

With the method of mounting the semiconductor device according to this embodiment, in a first step, the semiconductor device 1 provided with the plurality of the bumps 23 having the top face formed in a convex shape as shown in FIG. 5, in an inverted posture, is disposed on a circuit board 26 provided with a plurality of circuit electrodes 28 such that the respective bumps 23 are aligned with the respective circuit electrodes 28 so as to be opposed to each other as shown in FIG. 14.

Then, the opposed face of the respective bumps 23 on the semiconductor device 1 is brought in direct contact with the opposed face of the respective circuit electrodes 28 on the circuit board 26.

Thereafter, an ultrasonic press-bonding tool 30 shown in FIG. 14 is brought into contact with the semiconductor device 1 from the rear face side thereof, opposite from a side of a face thereof with the bumps 23 formed thereon, and ultrasonic vibration is applied thereto at a frequency in a range of 20 kHz to 30 kHz with output in a range of 50 mW to 200 mW for each of the bumps 23 while applying a load thereto in the order of 30 g to 100 g for each of the bumps 23. In this case, the ultrasonic vibration is applied for the duration of 0.5 seconds to 2 seconds.

Further, at the same time, the rear face of the circuit board 26, opposite from a face thereof with the circuit electrodes 28 formed thereon, is brought into contact with a hot plate 40, and the circuit board 26 is disposed on the hot plate 40, applying heat at a temperature in a range of 150° C. to 200° C. from the circuit board 26 side of the structure for mounting while applying ultrasonic vibration and a load from the side of the semiconductor device 1.

Figure 15:
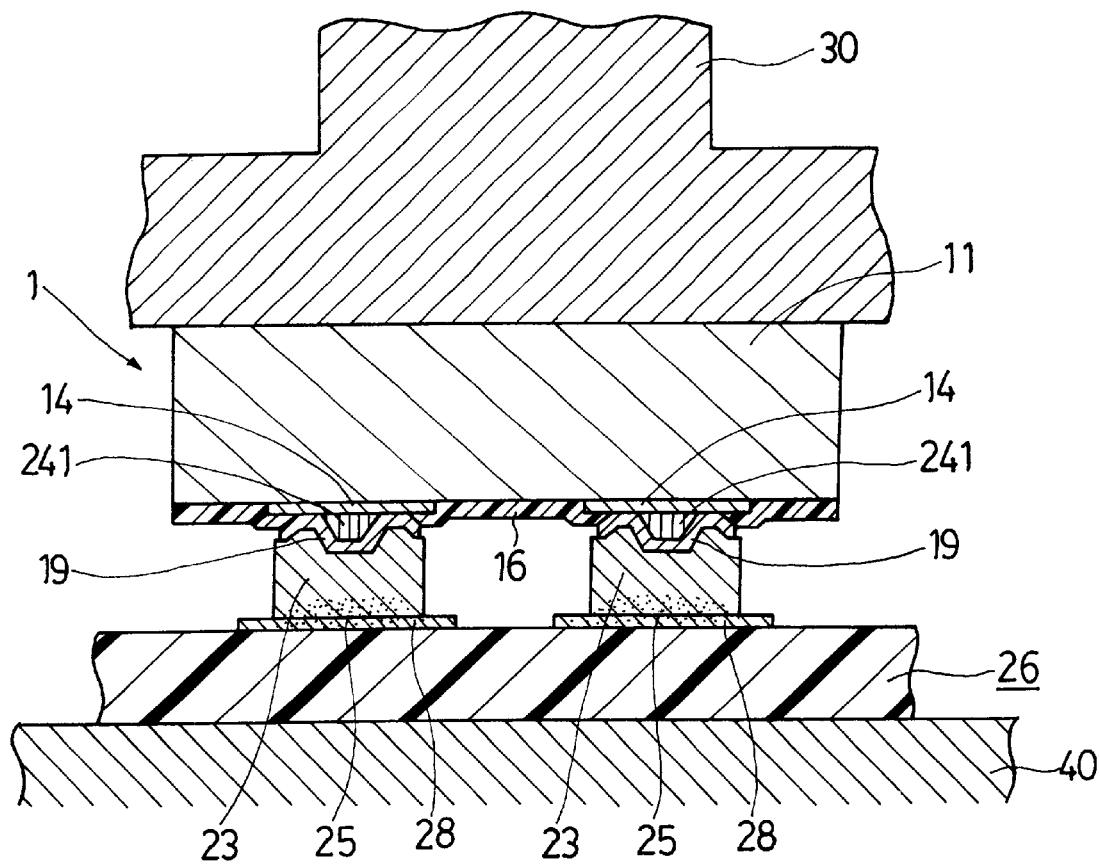

At this point in time, since the respective bumps 23 have the top face in a convex shape, a height of the central part 23a is reduced to the same height as a height of the peripheral part 23b as soon as bonding of the respective bumps 23 with the respective circuit electrodes 28 starts from a central part 23a thereof in an initial stage when the ultrasonic vibration is applied because the bumps 23 are made of gold, and are subjected to the previously-described treatments so as to lower the hardness thereof, so that bonding gradually spreads to the peripheral part 23b of the respective bumps 23, and a bonding face 25 uniformly planar across the top face of the respective bumps 23, bonded with the respective circuit electrodes 28, is finally formed as shown in FIG. 15.

As metal atoms and molecules present in the vicinity of the respective bonding faces 25 on both sides thereof are mutually diffused into each other, respectively, due to the effect of wave motion energy caused by ultrasonic vibration and thermal energy caused by heating, strong diffusion bonding can be effected.

Accordingly, the respective bumps 23 can be electrically connected with the respective circuit electrodes 28 at a very low connection resistance across the entire region of the respective bonding faces 25 with certainty.

Thereafter, the sealing resin 32 composed of epoxy resin shown in FIG. 6 is injected in a gap between the semiconductor device 1 and the circuit board 26, and is cured by applying baking treatment thereto, thereby completing the structure for mounting the semiconductor device as shown in FIG. 6.

Further, in carrying out this embodiment, the ultrasonic vibration is applied to the bumps 23 of the semiconductor device 1 and the circuit electrodes 28 of the circuit board 26, and a load is also applied thereto while applying heat in order to cause diffusion bonding to occur at the respective bonding faces 25. However, diffusion bonding can also be caused to occur at the respective bonding faces 25 by applying a load thereto while applying either the ultrasonic vibration or heat.

This embodiment has an advantageous effect in that the advantageous effect of the method of mounting the semiconductor device according to the first embodiment is more ensured and enhanced by this embodiment.

Particularly, it is to be pointed out that it has become possible to cause diffusion bonding to occur uniformly across the respective bonding faces 25 due to the convex shape in which the top face of the respective bumps 23 of the semiconductor device 1 is formed, thereby drastically improving electrical characteristics and mechanical strength of the diffusion bonding. As a result, high density bonding can be achieved at a low cost.

Second Embodiment of a Semiconductor Device and a Method of Fabricating the same: FIGS. 16 to 21

Next, a second embodiment of a semiconductor device and a method of fabricating the same according to the invention are described hereinafter with reference to FIGS. 16 to 21.

Figure 16:
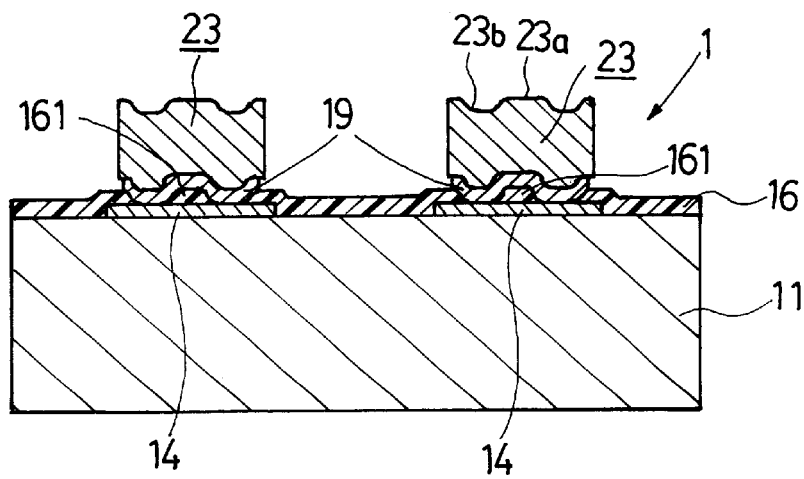
FIG. 16 is a schematic sectional view showing a second embodiment of a semiconductor device according to the invention.

FIG. 16 is a schematic sectional view similar to FIG. 5, showing the construction of the second embodiment of the semiconductor device according to the invention, and in FIG. 16, parts corresponding to those in FIG. 5 are denoted by like reference numerals, and description thereof is omitted.

The semiconductor device 1 differs from that according to the first embodiment shown in FIG. 5 only in that a mound-like member 161 provided on the central part of respective electrode pads 14 of a semiconductor chip 11 is formed of the same insulation film as an insulation film 16, and consequently, a height of a lower electrode 19 provided on top thereof is slightly reduced, thereby rendering the difference in height between the central part 23a of respective bumps 23 and the peripheral part 23b thereof equal to a thickness of the insulation film 16.

If the same method of mounting a semiconductor device on a circuit board as the previously-described method of mounting the semiconductor device according to the second embodiment is executed even by use of this semiconductor device 1, the same structure for mounting as the structure for mounting the semiconductor device according to the second embodiment as shown in FIG. 6 can be obtained, and an advantageous effect thereof is the same as that for the latter, therefore description thereof is omitted.

Accordingly, a method of fabricating the semiconductor device 1 described with reference to FIG. 16 is hereinafter described with reference to FIGS. 17 to 21 only in respect of steps differing from those of the previously-described method of fabricating the semiconductor device according to the first embodiment.

Figure 17:
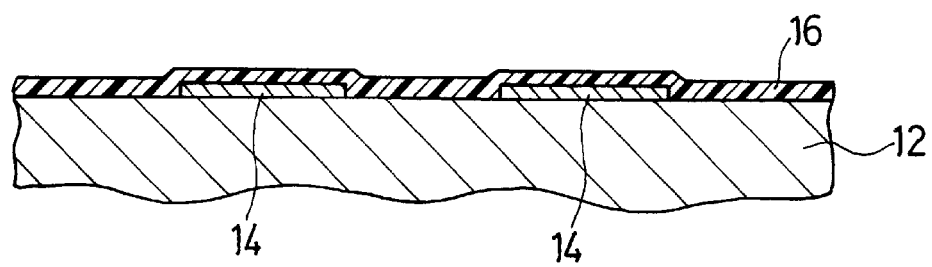
FIGS. 17 to 21 are schematic sectional views of a portion of a semiconductor substrate, sequentially showing respective steps of a second embodiment of a method of fabricating a semiconductor device according to the invention.

As shown in FIG. 17, an insulation film 16 is first formed to a thickness in a range of 0.8 μm to 1.0 μm on the entire surface of a semiconductor substrate 12 incorporating integrated circuits for a plurality of semiconductor chips, and provided with a plurality of electrode pads 14 for the respective semiconductor chips, formed on the surface thereof.

Figure 18:
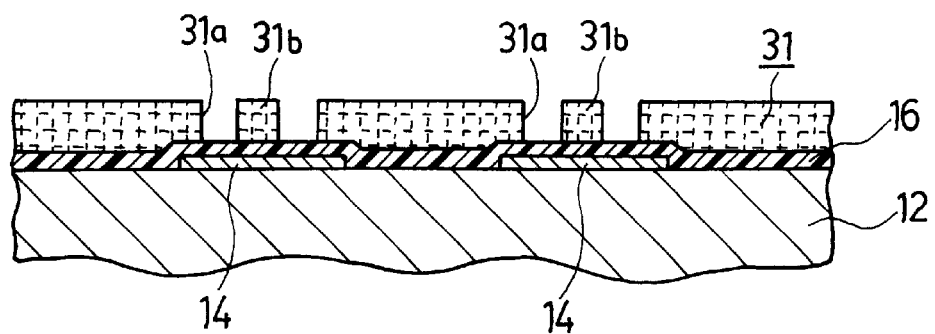

Subsequently, a first photosensitive resin 31 composed of a photosensitive polyimide resin shown in FIG. 18 is applied by the spin coater method to a suitable thickness on the entire surface of the insulation film 16.

Thereafter, the first photosensitive resin 31 is patterned by photolithography treatment comprising exposure and development treatments using a predetermined photomask such that an opening 31a in a ring-like shape is formed over the respective electrode pads 14 as shown in FIG. 18. As a result, a portion 31b of the first photosensitive resin 31 is left out over the central part of the respective electrode pads 14.

Figure 19:
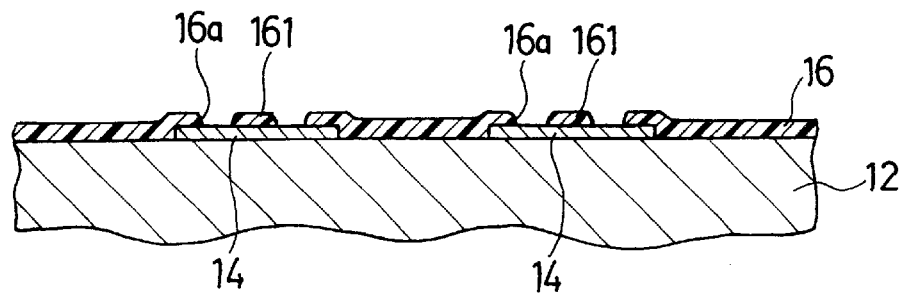

Subsequently, the insulation film 16 is patterned by applying an etching treatment thereto using the first photosensitive resin 31 as a mask, and an opening 16a in a ring-like shape is formed in portions of the insulation film 16 over the respective electrode pads 14 as shown in FIG. 19, thereby leaving out portions of the insulation film 16 as mound-like members 161 formed in the central part of the respective openings 16a.

Figure 20:
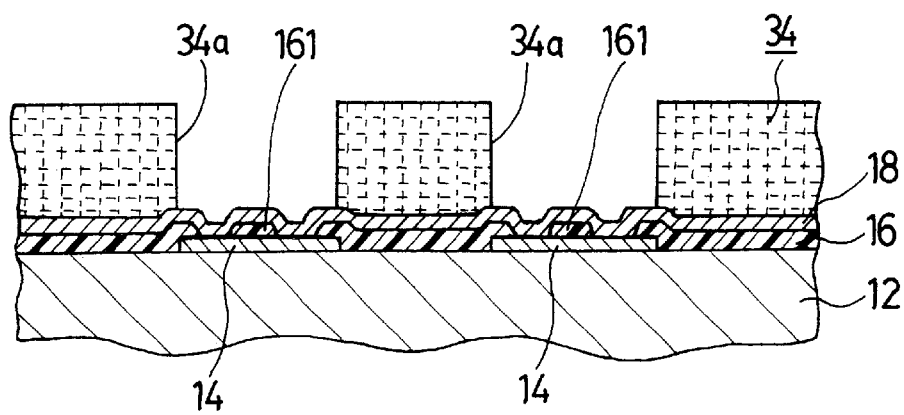

In a subsequent step, a common electrode film 18 is formed on the entire surface of the semiconductor substrate 12 by the sputtering method as shown in FIG. 20. The constituent material and layered structure of the common electrode film 18 are the same as those for the first embodiment.

Thereafter, as shown in FIG. 20, a second photosensitive resin 34 is applied by the spin coater method to a thickness of 20 μm to 25 μm on the entire surface of the common electrode film 18.

Subsequently, the second photosensitive resin 34 is patterned by photolithography treatment where exposure and development treatments are applied thereto using a predetermined photomask such that openings 34a are formed in the second photosensitive resin 34. The respective openings 34a are formed over the respective electrode pads 14 so as to be substantially in the same size as the respective electrode pads 14.

Figure 21:
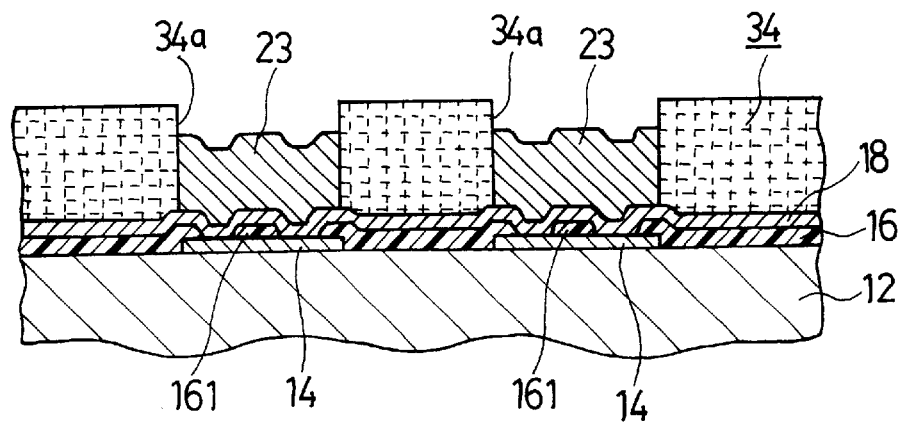

Subsequently, using the patterned second photosensitive resin 34 as a plating mask, the bump 23 composed of a gold plated layer is formed over the common electrode film 18 inside the respective openings 34a as shown in FIG. 21. In this case, electroplating is carried out under the same condition as that for the first embodiment.

By forming the gold plated layer so as not to allow a peripheral region thereof to protrude above the upper face of the photosensitive resin 34 serving as a mask in the course of the electroplating process, the bumps 23 in section come to have a profile having straight line sidewalls as shown in FIG. 21. Further, due to the convex shape of the respective mound-like member 161 composed of the insulation film 16, the bumps 23 can be formed so as to have the top face with the central part thereof raised higher than the peripheral part thereof.

Prior to the formation of the bump 23 inside the respective openings 34a of the second photosensitive resin 34 by the plating process, a hydrophilic treatment is preferably applied. The hydrophilic treatment may be applied by use of a wet method using a liquid chemical composed of, for example, a mixed solution of sulfuric acid and aqueous hydrogen peroxide, or by use of a dry method using, for example, oxygen plasma.

A step of forming the lower electrodes 19 after forming the bumps 23 in this way and removing the second photosensitive resin 34, a step of lowering the hardness of the bumps 23, and a dicing step are the same as those for the first embodiment previously described with reference to FIG. 13, and accordingly, description thereof is omitted.

Third Embodiment of a Semiconductor Device and a Method of Fabricating the Same: FIGS. 22 to 25

Next, a third embodiment of a semiconductor device and a method of fabricating the same according to the invention are described hereinafter with reference to FIGS. 22 to 25.

FIG. 22 is a schematic sectional view similar to FIG. 5, showing the construction of the third embodiment of the semiconductor device according to the invention, and in FIG. 22, parts corresponding to those in FIG. 5 are denoted by like reference numerals, and description thereof is omitted.

The semiconductor device 1 according to this embodiment differs from the semiconductor device 1 according to the first embodiment shown in FIG. 5 only in that a mound-like member 211 provided on the central part of respective electrode pads 14 of a semiconductor chip 11 is formed of an electrically conductive film.

The mound-like member 211 formed of the electrically conductive film may be formed to a thickness thicker than that of an insulation film 16, and may be a layered film made up of metal films in two or more layers.

A lower electrode 19 and a bump 23 are formed on top of the respective electrode pads 14 provided with the mound-like member 211 formed thereon, and the respective bumps 23 have the top face in a convex shape with the central part 23a thereof raised higher than the peripheral part 23b thereof to the extent of a thickness of the respective mound-like members 211.

If the same method of mounting a semiconductor device on a circuit board as the previously-described method of mounting the semiconductor device according to the second embodiment is executed even by use of this semiconductor device 1, the same structure for mounting as the structure for mounting the semiconductor device according to the second embodiment shown in FIG. 6 can be obtained, and an advantageous effect thereof is the same as that for the latter.

However, with this embodiment, as the respective mound-like members 211 are formed of the electrically conductive film, the respective bumps 23 are electrically connected with the respective electrode pads 14 via the respective mound-like members 211 as well, so that the whole region of a contact face thereof with the respective lower electrodes 19 can contribute to electrical continuity, thereby further lowering connection resistance. This makes it possible to render a size of the respective bumps 23 smaller.

Now, a method of fabricating the semiconductor device 1 described with reference to FIG. 22 is hereinafter described with reference to FIGS. 23 to 25 only in respect of steps differing from those of the previously-described method of fabricating the semiconductor device according to the first embodiment.

As shown in FIG. 23, an insulation film 16 having an opening 16a over the respective electrode pads 14 is first formed on a semiconductor substrate 12 provided with a plurality of electrode pads 14 formed thereon.

Subsequently, the electrically conductive film 21 thicker than the insulation film 16 is formed on the entire surface of semiconductor substrate 12 provided with the insulation film 16 formed thereon.

The electrically conductive film 21 may be made of a metallic material such as aluminum, nickel, copper, titanium, tantalum, tungsten, molybdenum, and so forth, forming a single layer or a plurality of layers by the sputtering method, or may have a chromium layer formed underneath the single layer or the plurality of the layers.

Thereafter, a first photosensitive resin 31 shown in FIG. 24 is applied to the entire surface of the electrically conductive film 21 by the spin coater method.

Subsequently, the first photosensitive resin 31 is patterned by photolithography treatment such that portions thereof are left out only over the central part of the respective electrode pads 14 as shown in FIG. 24.

Then, the electrically conductive film 21 is patterned by applying an etching treatment thereto using the portions of the first photosensitive resin 31 as masks such that a portion of the electrically conductive film 21 is left out only over the central part of the respective electrode pads 14 as the mound-like member 211. Thereafter, the first photosensitive resin 31 is removed.

Steps to be taken thereafter are the same as those of the first embodiment described with reference to FIGS. 10 to 13, therefore description thereof is omitted.

Fourth Embodiment of a Semiconductor Device and a Method of Fabricating the Same: FIGS. 26 to 30

Next, a fourth embodiment of a semiconductor device and a method of fabricating the same according to the invention are described hereinafter with reference to FIGS. 26 to 30.

Figure 26:
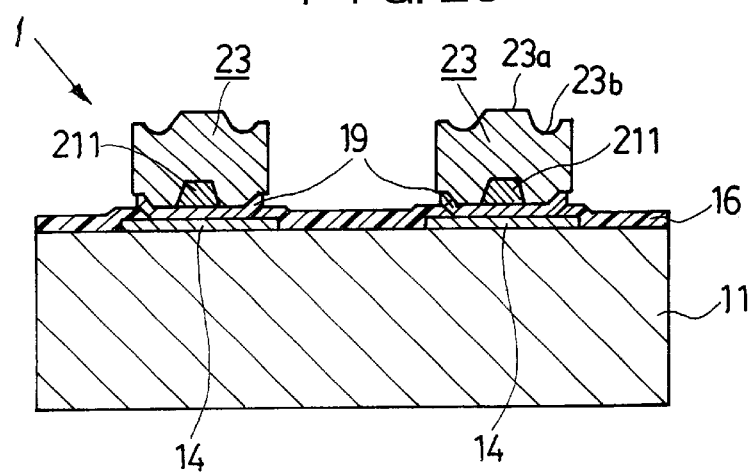
FIG. 26 is a schematic sectional view showing a fourth embodiment of a semiconductor device according to the invention.

FIG. 26 is a schematic sectional view similar to FIGS. 5 and 22, showing the construction of the fourth embodiment of the semiconductor device according to the invention, and in FIG. 26, parts corresponding to those in FIGS. 5 and 22 are denoted by like reference numerals, omitting description thereof.

The semiconductor device 1 according to the fourth embodiment differs from the semiconductor device 1 according to the third embodiment shown in FIG. 22 only in that a mound-like member 211 formed of an electrically conductive film is provided on a lower electrode 19 corresponding to the central part of respective electrode pads 14 of a semiconductor chip 11.

If the same method of mounting a semiconductor device on a circuit board as the previously-described method of mounting the semiconductor device according to the second embodiment is executed even by use of this semiconductor device 1, the same structure for mounting as the structure for mounting the semiconductor device according to the second embodiment shown in FIG. 6 can be obtained, and an advantageous effect thereof is the same as that for the case of using the semiconductor device according to the third embodiment described with reference to FIG. 22.

A method of fabricating the semiconductor device 1 described with reference to FIG. 26 is hereinafter described with reference to FIGS. 27 to 30 only in respect of steps differing from those of the previously-described method of fabricating the semiconductor device according to the first embodiment.

Figure 27:
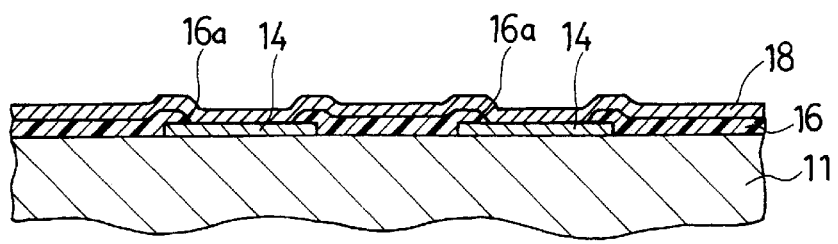

As shown in FIG. 27, an insulation film 16 having an opening 16a over respective electrode pads 14 is first formed on a semiconductor substrate 12 provided with a plurality of the electrode pads 14 formed thereon.

Subsequently, a common electrode film 18 connected with the respective electrode pads 14 through the respective openings 16a is formed on the entire surface of the semiconductor substrate 12, provided with the insulation film 16 formed thereon.

Figure 28:
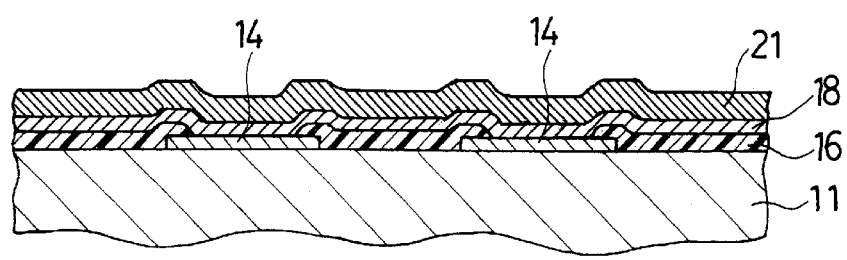

Thereafter, the electrically conductive film 21 is formed on the entire surface of the common electrode film 18 to a thickness thicker than the insulation film 16 as shown in FIG. 28. The constituent material and so on of the electrically conductive film 21 are the same as those for the third embodiment previously described.

Figure 29:
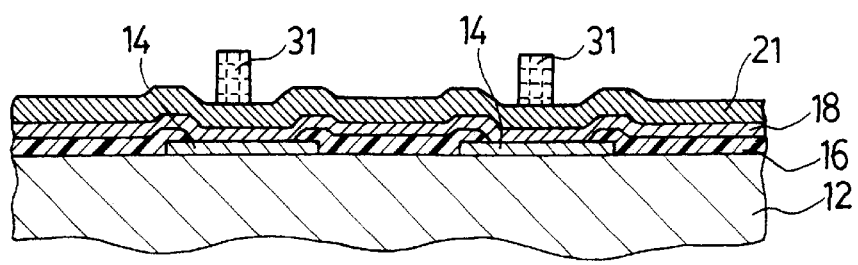
Figure 33:
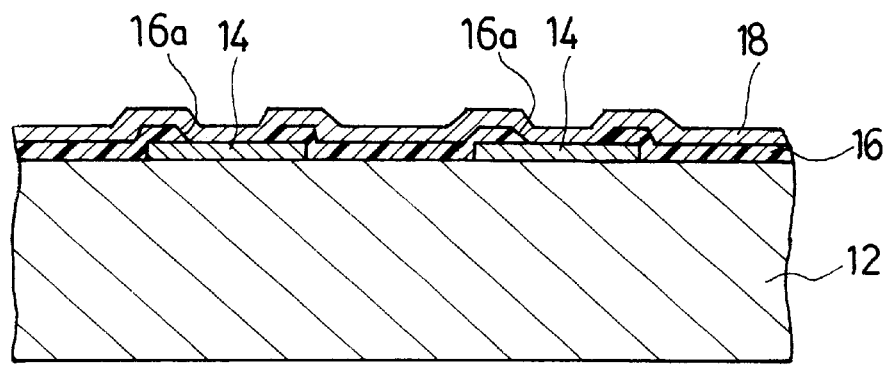
FIGS. 33 and 34 are schematic sectional views showing intermediate steps of a conventional method of fabricating a semiconductor device.
Figure 34:
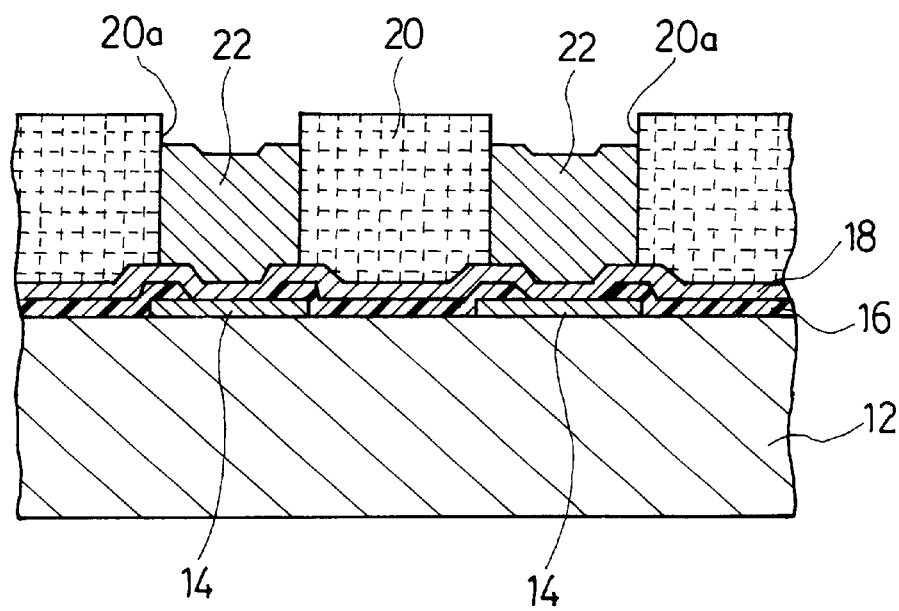

Subsequently, a first photosensitive resin 31 shown in FIG. 29 is applied to the entire surface of the electrically conductive film 21 by the spin coater method.

Then, the first photosensitive resin 31 is patterned by photolithography treatment so as to leave out portions thereof only on the electrically conductive film 21 corresponding to the central part of the respective electrode pads.

Thereafter, as shown in FIG. 30, the electrically conductive film 21 is patterned by applying an etching treatment thereto using the portions of the first photosensitive resin 31 as masks such that portions of the electrically conductive film 21 are left out only on portions of the common electrode film 18 corresponding to the central part of the respective electrode pads 14, as the mound-like members 211. Then, the first photosensitive resin 31 is removed.

Steps to be taken thereafter are the same as those of the first embodiment described with reference to FIGS. 10 to 13, therefore description thereof is omitted.

Fifth Embodiment of a Semiconductor Device and a Method of Fabricating the Same: FIGS. 31 and 32

A fifth embodiment of a semiconductor device and a method of fabricating the same according to the invention are described hereinafter with reference to FIGS. 31 and 32.

FIG. 31 is a schematic sectional view similar to FIGS. 5 and 22, showing the construction of the fifth embodiment of the semiconductor device according to the invention, and in FIG. 31, parts corresponding to those in FIGS. 5 and 22 are denoted by like reference numerals, and description thereof is omitted.

The semiconductor device 1 according to the fifth embodiment differs from the semiconductor device 1 according to the third embodiment shown in FIG. 22 only in that a mound-like member 37 composed of a metal film formed by means of plating is provided on the central part of respective electrode pads 14 of a semiconductor chip 11.

If the same method of mounting a semiconductor device on a circuit board as the previously-described method of mounting the semiconductor device according to the second embodiment is executed even by use of the semiconductor device 1 according to the fifth embodiment, the same structure for mounting as the structure for mounting the semiconductor device according to the second embodiment shown in FIG. 6 can be obtained, and an advantageous effect thereof is the same as that for the case of using the semiconductor device according to the third embodiment described with reference to FIG. 22.

Now, a method of fabricating the semiconductor device 1 described with reference to FIG. 31 is hereinafter described with reference to FIG. 32 only in respect of steps differing from those of the previously-described method of fabricating the semiconductor device according to the first embodiment.

The method of fabricating the semiconductor device 1 according to this embodiment is the same as that for the first embodiment in that an insulation film 16 having an opening 16a over respective electrode pads 14 is first formed on a semiconductor substrate 12 provided with a plurality of the electrode pads 14 formed thereon as shown in FIG. 32.

Subsequently, a first photosensitive resin 38 is applied by the spin coater method to the entire surface of the semiconductor substrate 12 provided with the insulation film 16 formed thereon.

Then, the first photosensitive resin 38 is patterned by photolithography treatment such that an opening 38a is formed only over the central part of the respective electrode pads 14.

Thereafter, by means of plating, a mound-like member 37 composed of a metal film is formed on the central part of the respective electrode pads 14 inside the respective openings 38a of the first photosensitive resin 38. For the plating, an electroless plating process is adopted, and thereby the metal film made of nickel, copper, or so forth is formed as the mound-like member 37. Subsequently, the first photosensitive resin 38 is removed.

Steps to be taken thereafter are the same as those of the first embodiment described with reference to FIGS. 10 to 13, omitting therefore description thereof is omitted.

As described in the foregoing, with the structure for mounting the semiconductor device, and the method of mounting the same according to the invention, when mounting a surface mount semiconductor device on a circuit board, connection of respective bumps of the semiconductor device with respective circuit electrodes of the circuit board can be effected mechanically strong as well as electrically at an extremely low connection resistance without use of the anisotropic conductive adhesive.

As a result, it becomes possible to reduce an area occupied per one bump, and to reduce a pitch at which the bumps are arranged, thereby enabling high density connection to be attained with high reliability.

Furthermore, by use of the semiconductor device according to the invention, the structure for mounting the same can be obtained more reliably and effectively, and with the method of fabricating the same according to the invention, any of the semiconductor devices according to the invention can be fabricated efficiently while maintaining high quality.

What is claimed is:

1. A semiconductor device comprising:

a semiconductor chip provided with integrated circuits, and a plurality of electrode pads for connecting the integrated circuits with an external circuit;

an insulation film covering a face of the semiconductor chip, provided with the plurality of the electrode pads, and having an opening over the respective electrode pads;

a mound-like member provided on the central part of the respective electrode pads inside the respective openings of the insulation film;

a plurality of lower electrodes each provided over the peripheral region of the respective openings of the insulation film and over the respective mound-like members in such a way as to be individually and electrically conductive with the respective electrode pads through the respective openings of the insulation film; and a plurality of bumps, each provided on the respective lower electrodes and formed such that the central part of the top face thereof is raised higher than the peripheral region thereof to the extent of a thickness of the respective mound-like members.

2. A semiconductor device according to claim 1, wherein the mound-like members are formed of a photosensitive resin.

3. A semiconductor device according to claim 1, wherein the mound-like members are formed of the same material as the constituent material of the insulation film.

4. A semiconductor device according to claim 1, wherein the mound-like members are formed of an electrically conductive material.

5. A semiconductor device according to claim 4, wherein the electrically conductive material is a metal film formed by an electroless plating process.

6. A semiconductor device comprising:

a semiconductor chip provided with integrated circuits, and a plurality of electrode pads for connecting the integrated circuits with an external circuit;

an insulation film covering a face of the semiconductor chip, provided with the plurality of the electrode pads, and having an opening over the respective electrode pads;

a plurality of lower electrodes each provided over the respective electrode pads and the peripheral region of the respective openings of the insulation film in such a way as to be individually and electrically conductive with the respective electrode pads through the respective openings of the insulation film;

a mound-like member provided on the central part of the respective lower electrodes; and a plurality of bumps each provided on the respective lower electrodes and formed such that the central part of the top face thereof is raised higher than the peripheral region thereof to the extent of a thickness of the respective mound-like members.

7. A semiconductor device according to claim 6, wherein the mound-like members are formed of an electrically conductive material.

* * * * *